United States Patent
Takechi et al.

(10) Patent No.: US 6,344,304 B1
(45) Date of Patent: Feb. 5, 2002

(54) RADIATION SENSITIVE MATERIAL AND METHOD FOR FORMING PATTERN

(75) Inventors: Satoshi Takechi; Makoto Takahashi; Yuko Kaimoto, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/438,416

(22) Filed: Nov. 12, 1999

Related U.S. Application Data

(62) Division of application No. 08/999,394, filed on Dec. 29, 1997, now Pat. No. 6,004,720, which is a continuation of application No. 08/365,407, filed on Dec. 28, 1994, now abandoned.

(30) Foreign Application Priority Data

Dec. 28, 1993 (JP) ................................. 5-337434

(51) Int. Cl.$^7$ ............................................. G03F 7/004
(52) U.S. Cl. ...................................... 430/270.1
(58) Field of Search ....................... 430/270.1

(56) References Cited

U.S. PATENT DOCUMENTS

| | | | |
|---|---|---|---|
| 5,071,730 A | 12/1991 | Allen et al. | 430/270 |
| 5,077,174 A | 12/1991 | Bauer et al. | 430/270 |
| 5,230,984 A | 7/1993 | Tachiki et al. | 430/270 |
| 5,279,923 A | 1/1994 | Hiro et al. | 430/270 |
| 5,384,229 A | 1/1995 | Pai et al. | 430/270 |
| 5,399,647 A * | 3/1995 | Nozaki et al. | 526/297 |
| 5,474,872 A * | 12/1995 | Tomo et al. | 430/270 |
| 5,506,088 A | 4/1996 | Nozaki et al. | 430/270.1 |
| 5,635,332 A | 6/1997 | Nakano et al. | 430/270.1 |
| 5,679,495 A * | 10/1997 | Yamachika et al. | 430/191 |
| 5,738,975 A | 4/1998 | Nakano et al. | 430/280.1 |
| 5,851,727 A | 12/1998 | Choi et al. | 430/270.1 |

FOREIGN PATENT DOCUMENTS

| | | |
|---|---|---|
| EP | 0 487 261 A1 | 5/1992 |
| EP | 0 544 465 A1 | 6/1993 |
| JP | 5-72738 | 3/1993 |
| JP | 5-80516 | 4/1993 |
| JP | 5-265212 | 10/1993 |

* cited by examiner

*Primary Examiner*—Rosemary Ashton
(74) *Attorney, Agent, or Firm*—Arent Fox Kintner Plotkin & Kahn, PLLC

(57) ABSTRACT

A radiation sensitive composition comprising a copolymer having a structural unit of (me)acrylonitrile and a structural unit generating an alkali soluble group and a substance generating an acid by application of radiation.

4 Claims, 6 Drawing Sheets

RADIATION SENSITIVE MATERIAL AND METHOD FOR FORMING PATTERN

This is a divisional application of U.S. Ser. No. 08/999,394, filed Dec. 29, 1997 now U.S. Pat. No. 6,004,720, which is a continuation of U.S. Ser. No. 08/365,407, filed Dec. 28, 1994, now abandoned.

BACKGROUND OF THE INVENTION

The present invention relates to a radiation sensitive material and a process for forming a pattern using the same.

Recently, semiconductor integrated circuits have become more integrated and LSIs and VLSIs are practically available. Accompanying such integration, circuit patterns have become smaller in size, approaching submicron dimensions and even smaller. Formation of a pattern in a submicron dimension essentially requires lithography. In lithography a thin film resist is deposited on to a substrate to be processed, and is selectively exposed and developed to form a resist pattern. With this resist pattern as a mask, dry etching is conducted and then the resist is removed to obtain a required pattern. As an exposure source for lithography, ultraviolet radiation was originally used, but as circuit patterns approach submicron sizes, far ultraviolet radiation (e.g. electron beams, X rays, etc.) with short wavelengths, are used as exposure sources.

Especially for lithography using excimer lasers (248-nm wavelength KrF laser and 193-nm wavelength ArF laser), resist materials having high resolution, high sensitivity and good dry-etching resistance are required.

Many conventionally developed resists are based on phenol resin and novolak resin. These materials have aromatic rings and good dry etching resistance, but they have poor transparency at KrF wavelength and are totally opaque at ArF wavelength. Consequently they can not provide patterns sufficiently precise in submicron dimensions.

On the other hand, as a transparent resist for excimer beams, t-butyl methacrylate polymer is proposed, but this resist lacks dry etching resistance.

As a countermeasure to this, the inventors have proposed a chemical amplification type resist using alicyclic groups as a resist having dry etching resistance comparable with that of aromatic compounds and are transparent at KrF and ArF wavelength. Here alicyclic groups are adamantane, norbornane, perhydroantracene, cyclohexane, tricyclo [5.2.1.0$^{2,6}$] decane etc., and adamantyl groups are suitable (see Japanese Patent Laid-Open Publication No. 39665/1992).

But the chemical amplification type resist of alicyclic copolymer increases hydrophobicity and rigidity of the alicyclic group, which gives dry etching resistance, increases its composition ratio.

At a composition ratio which gives dry etching resistance comparable to that of phenol resin-based and novolak resin-based resists, e.g., above 50 mol % of alicyclic unit, because of high hydrophobicity and rigidity of the resists, diffusion of protonic acid as a catalyst is hindered, which results in lower amplification, smaller amounts of carboxylic acid being generated, and lower solubility to a developer of an alkaline aqueous solution.

Furthermore, these resists lack adhesiveness, and, in addition, their resist films are rigid because of inclusion of alicyclic groups. As a result, strain caused to the resist films become larger, and the resist films have a greater tendency to peel off. Accordingly stable pattern characteristics cannot be obtained. This is also a problem.

SUMMARY OF THE INVENTION

In view of these problems, an object of the present invention is to provide a radiation sensitive material for an excimer laser lithography, having good transparency and etching resistance, is highly sensitive, has good adhesion and to provide a method for forming a circuit pattern using the radiation sensitive material.

Another object of the present invention is to provide a method for forming a pattern which can produce a protective film from even a non-phenol based polymer of low polarity, and which can have stable pattern characteristics.

The above-described object of the present invention is achieved by a radiation sensitive material comprising: a copolymer expressed by a general formula

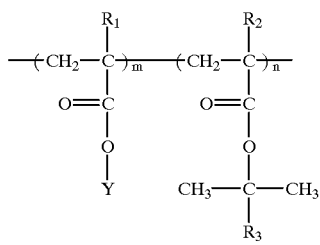

(where Y represents alicyclic group; $R_1$ and $R_2$ represent $CH_3$ or H, and at least one of $R_1$ and $R_2$ is H; and $R_3$ represents alkyl group); and a substance generating an acid by application of radiation.

In the above-described radiation sensitive material, it is preferable that the copolymer includes, by 40–70 mol %, a unit structure including alicyclic groups.

The above-described object of the present invention is achieved by a radiation sensitive material comprising: a copolymer including a unit structure which is expressed by a general formula

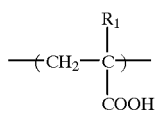

(where $R_1$ represents $CH_3$ or H); and which generates an alkali soluble group in the presence of methacrylic acid or acrylic acid, and an acid; and a substance generating an acid by application of radiation.

The above-described object of the present invention is achieved by a radiation sensitive material comprising: a terpolymer expressed by a general formula

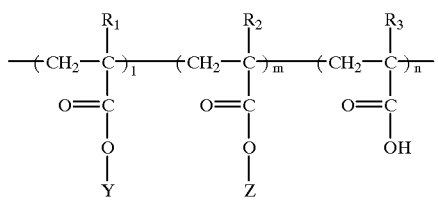

(where Y represents alicyclic group;

Z represents —C(CH$_3$)$_2$R$_4$,

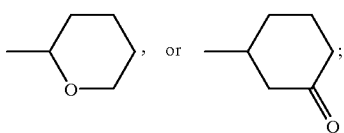

R$_1$, R$_2$, and R$_3$ represent CH$_3$ or H; and R$_4$ represents alkyl group); and a substance generating an acid by application of radiation.

Here groups which generate alkali soluble groups in the presence of acid are, an ester group, t-butyl group, tetrahydropyranyl group, α,α-dimethylbenzyl group, 3-oxocyclohexyl group, etc., and groups which are released in the presence of protonic acid can be used. In view of transparency with respect to excimer beams, groups without benzene rings are suitable. Thus, t-butyl group, tetrahydropyranyl group, 3-oxocyclohexyl group are more preferable.

In the above-described radiation sensitive material, it is preferable that the copolymer includes the unit structure having carboxylic acid in the range of 5–35 mol %.

The above-described object of the present invention is achieved by a radiation sensitive material comprising: a copolymer including a unit structure which is expressed by a general formula

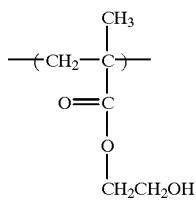

and which generates an alkali soluble group in the presence of methacrylic acid and an acid; and a substance generating an acid by application of radiation.

The above-described object is achieved by a radiation sensitive material comprising: a terpolymer expressed by a general formula

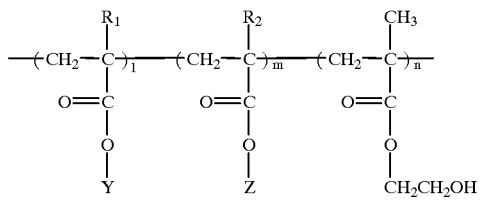

(where Y represents alicyclic group; and
Z represents —C(CH$_3$)$_2$R$_3$,

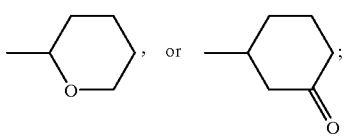

R$_1$ and R$_2$ represent CH$_3$ or H; and R$_3$ represents alkyl group); and a substance generating an acid by application of radiation.

Here groups which generate alkali soluble groups in the presence of acid are, as ester group, t-butyl group, tetrahydropyranyl group, α,α-dimethylbenzyl group, 3-oxocyclohexyl group, etc., and groups which are released in the presence of protonic acid can be used. In view of transparency with respect to excimer beams, groups without benzene rings are suitable. Thus, t-butyl group, tetrahydropyranyl group, 3-oxocyclohexyl group are more preferable.

In the above-described radiation sensitive material, it is preferable that the copolymer includes the hydroxyethyl methacrylate by above 5 mol %.

The above-described object of the present invention is achieved by a radiation sensitive material comprising: a copolymer including a unit structure expressed by

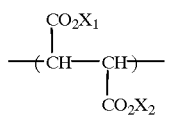

(where X$_1$ and X$_2$ represent —C(CH$_3$)$_2$R$_1$,

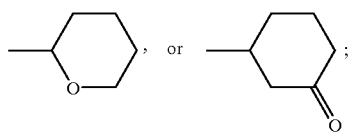

and R$_1$ represents alkyl group); and a unit structure generating an alkali soluble group in the presence of an acid; and a substance generating acid by application of radiation.

The above-described object of the present invention is achieved by a radiation sensitive material comprising: a copolymer expressed by a general formula

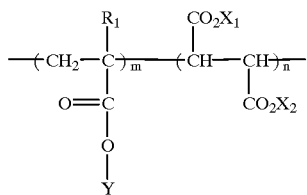

(where X$_1$ and X$_2$ represent —C(CH$_3$)$_2$R$_2$,

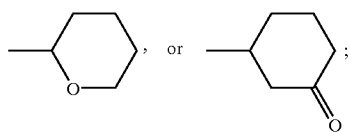

Y represents alicyclic group; R$_1$ represent CH$_3$ or H; and R$_2$ represents alkyl group); and a substance generating an acid by application of radiation.

The above-described object of the present invention is achieved by a radiation sensitive material comprising: a copolymer including a unit structure expressed by

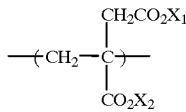

(where $X_1$ and $X_2$ represent —$C(CH_3)_2R_1$,

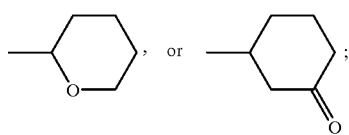

and $R_1$ represents alkyl group); and a unit structure generating an alkali soluble group in the presence of an acid; and a substance generating an acid by application of radiation.

The above-described object of the present invention is achieved by a radiation sensitive material comprising: a copolymer expressed by a general formula

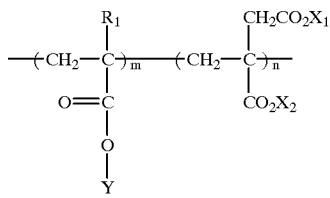

where $X_1$ and $X_2$ represent —$C(CH_3)_2R_2$,

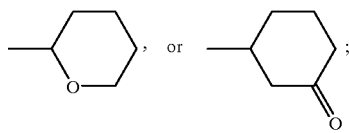

Y represents alicyclic group; $R_1$ represent $CH_3$ or H; and $R_2$ represents alkyl group); a substance generating an acid by application of radiation.

The above-described object of the present invention is achieved by a radiation sensitive material comprising: a copolymer including a unit structure expressed by a general formula

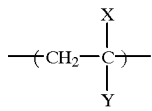

(where at least one of X and Y is a nitrile group) and a unit structure generating an alkali soluble group; and a substance generating an acid by application of radiation.

In the above-described radiation sensitive material, it is preferable that the copolymer includes t-butyl groups.

In the above-described radiation sensitive material, it is preferable that the copolymer includes alicyclic groups.

In the above-described radiation sensitive material, it is preferable that the unit structure

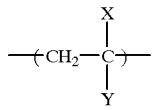

(where at least one of X and Y is nitrile group) is acrylonitrile or methacrylonitrile.

In the above-described radiation sensitive material, it is preferable that the copolymer includes the acrylonitrile or methacrylonitrile by 10–70 mol %.

The above-described object is achieved by a radiation sensitive material comprising a terpolymer expressed by a general formula

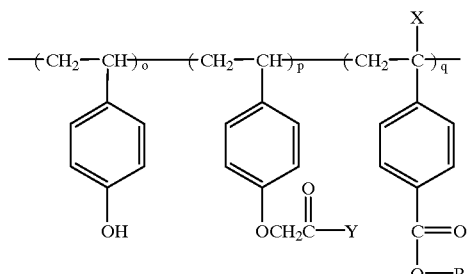

(where X represents H or $CH_3$;

R represents

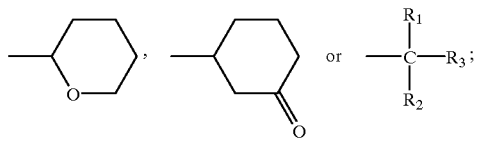

and $R_1$ and $R_2$ represent H, $R_3$ represents

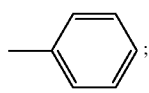

$R_1$ represents $CH_3$, $R_2$ represents H, $R_3$ represents

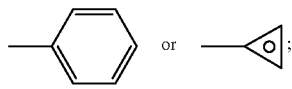

$R_1$ and $R_2$ represent $CH_3$, $R_3$ represents

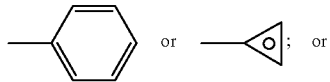

$R_1$, $R_2$ and $R_3$ represent $CH_3$); and a substance generating an acid by application of radiation.

The above-described object is achieved by a radiation sensitive material comprising a resist containing a hydrophilic group and a hydrophobic compound.

It is preferred that the resist containing a hydrophilic group is a copolymer expressed by a general formula

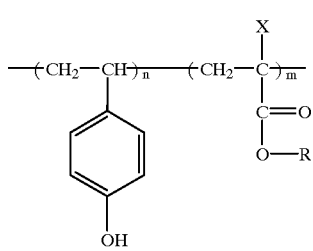

(where X represents H or $CH_3$;

R represents

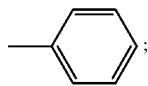

and $R_1$ and $R_2$ represent H, $R_3$ represents

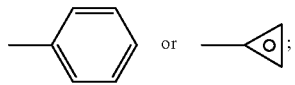

$R_1$ represents $CH_3$, $R_2$ represents H, $R_3$ represents

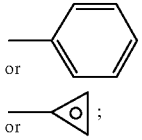

$R_1$ and $R_2$ represent $CH_3$, $R_3$ represents

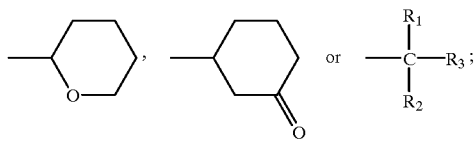

$R_1$, $R_2$ and $R_3$ represent $CH_3$)

In the above-described radiation sensitive material, the resist contains vinylphenol, which contains hydrophilic groups, in the range of 50–70 mol %.

In the above-described radiation sensitive material, the resist containing hydrophilic groups is a copolymer expressed by a general formula

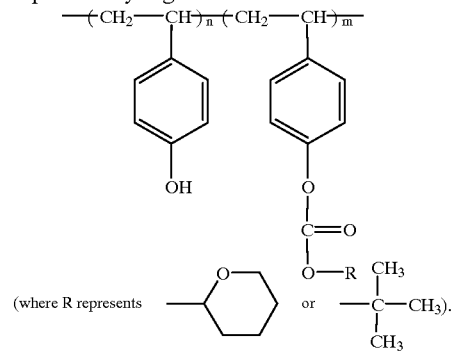

In the above-described radiation sensitive material, it is preferred that the resist contains vinylphenol, which contains hydrophilic groups, in the range of 60–80 mol %.

In the above-described radiation sensitive material, it is preferred that the hydrophobic compound is expressed by a general formula

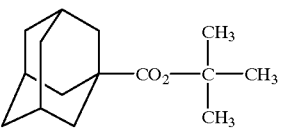

In the above-described radiation sensitive material, it is preferred that the hydrophobic compound is expressed by a general formula

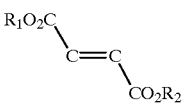

(where $R_1$ and $R_2$ represent

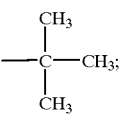

or $R_1$ represents

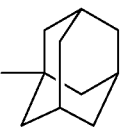

or

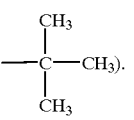

$R_2$ represents

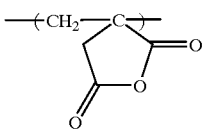

The above-described object of the present invention is achieved by a radiation sensitive material comprising a copolymer including itaconic anhydride which is expressed by and a polymer as a unit structure generates an alkali soluble group in the presence of an acid; and a substance generating an acid, upon application of radiation.

In the above-described radiation sensitive material, it is preferred that the copolymer is expressed by a general formula

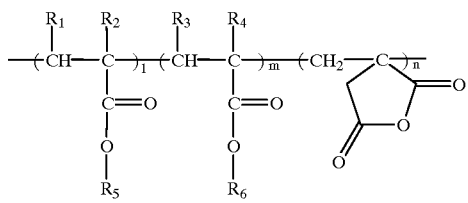

(where 1, m and n represent 0–60 mol %, 10–95 mol %, 5–50 mol % respectively; $R_1$, $R_2$, $R_3$ and $R_4$ represent H, halogen, $C_{1-4}$ alkyl group, $C_{1-4}$ substituted alkyl group, nitrile group, $-(CH_2)_nCOOR_5(n=0-1)$ or $-(CH_2)_nCOOR_6$ (n=0–1); $R_5$ represents $C_{1-5}$ alkyl group, $C_{1-5}$ substituted alkyl group, alicyclic group, substituted alicyclic group, aromatic group or substituted aromatic group; and $R_6$ represents t-butyl group, t-amyl group, dimethylbenzyl group, tetrahydropyranyl group or 3-oxocyclohexyl group).

In the above-described radiation sensitive material, it s preferred that the copolymer is expressed by

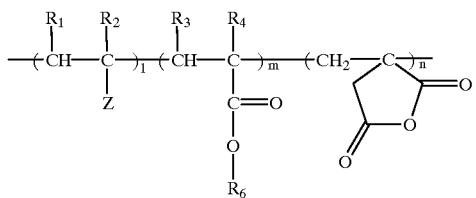

(where 1, m and n represent 1–95 mol %, 10–95 mol % and 5–50 mol %; Z represents benzene ring, substituted benzene ring, nitrile group, $-OR_7$, $-COR_7$ or $-OCOR_7$; $R_1$, $R_2$, $R_3$ and $R_4$ represent H, halogen, $C_{1-4}$ alkyl group, $C_{1-4}$ substituted alkyl group, nitrile group, $-C(CH_2)_nCOOR_5(n=0-1)$, or $-(CH_2)_nCOOR_6(n=0-1)$; $R_6$ represents t-butyl group, t-amyl group, dimethylbenzyl group, tetrahydropyranyl group or 3-oxocyclohexyl group; $R_7$ represents $C_{1-5}$ alkyl group, $C_{1-5}$ substituted alkyl group, alicyclic group, substituted alicyclic group, aromatic group or substituted aromatic group).

In the above-described radiation sensitive material, it is preferred that the copolymer is expressed by a general formula

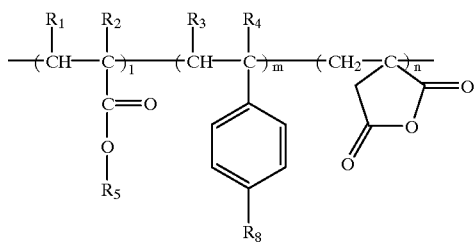

(where 1, m and n represent 0–95 mol %, 1–95 mol % and 5–50 mol % $R_1$, $R_2$, $R_3$ and $R_4$ represent H, halogen, $C_{1-4}$ alkyl group, $C_{1-4}$ substituted alkyl group, nitrile group, $-(CH_2)_nCOOR_5(n=0-1)$ or $-(CH_2)_nCOOR_6(n=0-1)$; $R_5$ represents $C_{1-5}$ alkyl group, $C_{1-5}$ substituted alkyl group, alicyclic group, substituted alicyclic group, aromatic group or substituted aromatic group; and $R_8$ represents $-OtBu$, $-OCOOtBu$ or $-COOt$-Amyl).

In the above-described radiation sensitive material, the copolymer is expressed by a general formula

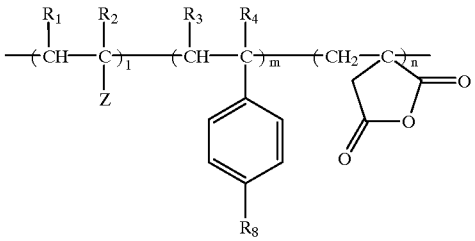

(where 1, m and n represent 0–95 mol %, 1–95 mol % and 5–50 mol %; Z represents benzene ring, substituted benzene ring, nitrile group, $OR_7$, $-COR_7$ or $-OCOR_7$; $R_1$, $R_2$, $R_3$ and $R_4$ represent H, halogen, $C_{1-4}$ alkyl group, $C_{1-4}$ substituted alkyl group, nitrile group, $-(CH_2)_nCOOR_5(n=0-1)$ or $-(CH_2)_nCOOR_6(n=0-1)$; and $R_8$ represents $-OtBu$, $-OCOOtBu$, or $-COOt$-Amyl).

In the above-described radiation sensitive material, it is preferred that the copolymer includes the unit structure including itaconic anhydride by 5–50 mol %.

The above-described object of the present invention is achieved by a method for forming a pattern comprising the steps of: preparing a resist of the above-described radiation sensitive material; applying the resist to a substrate to be processed; prebaking the resist film and then selectively exposing the resist on the substrate to radiation; and post exposure baking and then developing the resist on the substrate to form the pattern.

The above-described object of the present invention is achieved by a method for forming a pattern comprising the steps of: preparing a resist of a radiation sensitive material; applying the resist to a substrate to be processed; prebaking the resist film and then selectively exposing the resist on the substrate to radiation; and post exposure baking the substrate and then developing the resist on the substrate by a developer being a mixed liquid of an organic alkaline aqueous solution and isopropyl alcohol to form the pattern.

Here the radiation sensitive material preferably comprises: a copolymer including a unit structure including alicyclic groups, e.g., adamantyl groups, norbornyl group, and a unit structure generating an alkali soluble group in the presence of an acid; and a substance generating an acid by application of radiation.

In the above-described radiation sensitive material, it is preferable that the developer contains isopropyl alcohol by 5–95 vol %.

The above-described object is achieved by a method for forming a pattern comprising the steps of: preparing a resist of a polymer containing an acrylic or methacrylic ester unit, having an alicyclic group at said acrylic or methacrylic ester unit; where said acrylic or methacrylic ester unit have a polar structure at an ester unit; coating a substrate to be processed with the resist, and prebaking the substrate to be processed; applying onto the resist a protecting film of a hydrocarbon-based polymer, which is transparent to far ultraviolet rays, and heating the same; selectively exposing radiation to the resist on the substrate to be processed; postbaking the substrate to be processed; stripping the protecting film; and developing the resist on the substrate to be processed to form a desired resist pattern, an application solvent for the hydrocarbon-based polymer of the protecting film being a non-aromatic hydrocarbon, or an aromatic hydrocarbon expressed by a general formula

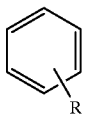

(where R represents an alkyl group with 3 or more carbon atoms).

The above-described object of the present invention is achieved by a method for forming a pattern comprising the steps of forming a resist of a radiation sensitive material coating a substrate-to-be-processed with the resist, and pre-baking the substrate to be processed; applying a protecting film of a hydrocarbon polymer, which is transparent to far ultraviolet rays, and heating the same; selectively exposing radiation to the resist on the substrate to be processed, and postbaking the substrate to be processed; and stripping the protecting film, and developing the resist on the substrate to be processed to form a desired resist pattern.

In the above-described method for forming a pattern, it is preferred that an application solvent for the hydrocarbon polymer for the protecting film is limonene, 1,5-cyclooctadiene, 1-decene, t-butylcyclohexane, p-cymene or dodecylbenzene.

In the method for forming a pattern, it is preferred that the hydrocarbon polymer is an olefine polymer or a diene polymer.

In the above-described method, the substance having a polar-structure is ketone, alcohol, ether, ester, carbonic acid, an acid anhydride or any one of these substances having a part of the atoms of a polar structure.

A substance generating an acid by application of radiation used in the above-described radiation sensitive material, i.e., an acid generating substance can be provided by:

an oxazole derivative expressed by the general formula

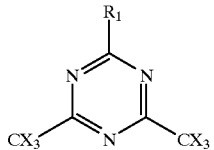

(where $R_1$ represents a substituted or an unsubstituted aryl group or alkenyl group; and X represents Cl or Br), an s-triazine derivative expressed by the general formula

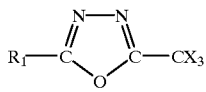

(where $R_1$ represents $CH_3$, a substituted or an unsubstituted alkyl group, or a substituted or an unsubstituted aryl or alkenyl group; and X represents Cl or Br), an iodonium salt expressed by the general formula

(where $Ar_1$ and $Ar_2$ represent a substituted or an unsubstituted aromatic ring; and X represents $BF_6^-$, $PF_6^-$, $AsF_6^-$, $SbF_6^-$ or $ClO_4^-$, or an organic sulfonic acid anion), a sulfonium salt expressed by the general formula

(where $R_1$, $R_2$ and $R^3$ represent a substituted or unsubstituted alkyl group, or an aromatic ring; X represents $BF_6^{31}$, $PF_6^-$, $AsF_6^-$, $SbF_6^-$ or $ClO_4$, or an organic sulfonic acid anion), a disulfone derivative expressed by the general formula

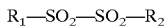

(where $R_1$ represent a substituted aromatic ring or an alicyclic group), an imidosulfonate derivative expressed by the general formula

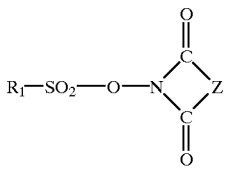

(where $R_1$ represents a substituted or unsubstituted alkyl group or aryl group; and Z represents a substituted or unsubstituted alkylene group, alkeneylene group or aryl group), or a diazonium salt expressed by the general formula

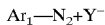

(where $Ar_1$ represents a substituted or an unsubstituted aromatic ring; Y represents $BF_1^-$, $PF_6^-$, $AsF_6^-$, $SbF_6^-$ or $ClO_4^-$, or an organic sulfonic acid anion). But the acid generating substance is not limited to the above-described substances.

In the radiation sensitive material comprising a copolymer expressed by the following general formula

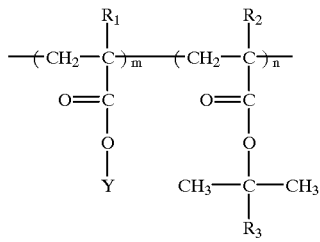

(where Y represents alicyclic group; $R_1$ and $R_2$ represent $CH_3$ or H, and at least one of $R_1$ and $R_2$ is H; and $R_3$ represents alkyl group); and an acid generating material by application of radiation, either of $R_1$ and $R_2$ at the α positions is not a methyl group, which is bulky and very hydrophobic, but a proton, which is small-sized and less hydrophobic. Accordingly the copolymer is less hydrophobic and less rigidity. Consequently the copolymer is more compatible with and permeable to a developer, while protonic acid as a catalyst can be more diffusible. Development is therefore easier, resulting in higher sensitivity and stable patterning characteristics.

Here it is preferable that this copolymer contains a unit structure containing alicyclic groups by 40–70 mol %. In the composition with below 40 mol % of the unit structure, sufficient dry etching resistance cannot be obtained. The composition with above 70 mol % of the unit structure makes patterning difficult because of a small amount of t-butyl, a photosensitive group.

The radiation sensitive material comprising a copolymer expressed by the following general formula

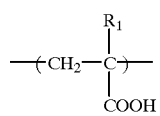

(where $R_1$ represents $CH_3$ or H); and an acid generating substance by application of radiation can have higher sensitivity and stable patterning characteristics because of the carboxylic acid contained in the copolymer, which is an effective hydrophilic group.

That is, because carboxylic acid is alkali soluble, the copolymer originally containing carboxylic acid becomes an alkaline aqueous solution only by substitution of the sensitive groups by a small amount of carboxylic acid. Accordingly, high sensitivity and stable patterning characteristics can be obtained.

In the radiation sensitive material comprising a terpolymer expressed by the following general formula

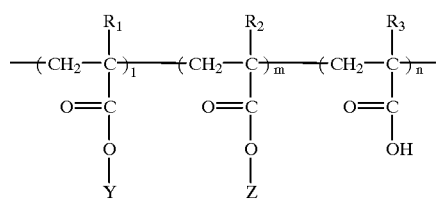

(where Y represents alicyclic group;

Z represents —$C(CH_3)_2R_4$,

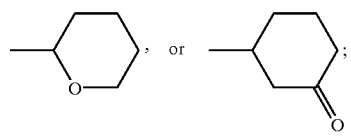

$R_1$, $R_2$, and $R_3$ represent $CH_3$ or H; and $R_4$ represents alkyl group); and a substance generating acid by application of radiation, it is very effective that the terpolymer contains carboxylic acid, which is hydrophilic, because the terpolymer contains alicyclic groups, which are very hydrophobic.

It is preferable that the terpolymer contains carboxylic acid by above 5 mol % and below 35 mol %. This is because with a carboxylic acid content of below 5 mol %, the effect is not exhibited, and with a carboxylic acid content of above 35 mol %, even non-exposed portions are solved and thus patterning is impossible.

In the radiation sensitive material comprising a copolymer including a unit structure, which is expressed by the following general formula

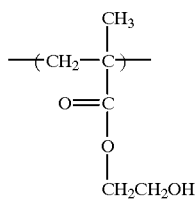

and which generates alkali soluble groups in the presence of hydroxyethyl methacrylate and an acid, and an acid generating substance by application of radiation, the copolymer contains hydroxyethyl methacrylate as hydrophilic groups, whereby as in the case that the copolymer contains carboxylic acid, the copolymer has higher hydrophilicity, and thus is more compatible with a developer and is permeable, resulting in higher solubility.

In the radiation sensitive material comprising a terpolymer containing a unit structure which is expressed by the following general formula

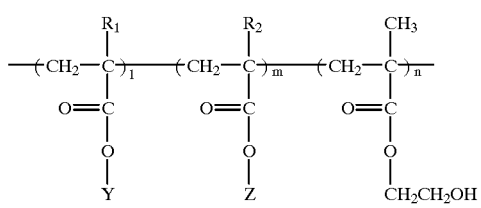

(where Y represents alicyclic group;

Z represents —$C(CH_3)_2R_4$,

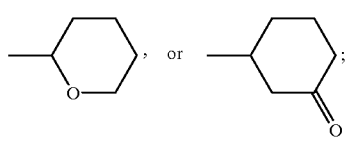

$R_1$ and $R_2$ represent $CH_3$ or H; and $R_3$ represents alkyl group); and an acid generating substance by application of radiation, because the terpolymer contains alicyclic groups, which are very hydrophobic, it is very effective that the terpolymer contains hydroxyethyl methacrylate as a hydrophobic group.

It is preferable that the terpolymer contains hydroxyethyl methacrylate by above 5 mol % because the effect is not exhibited with a content of hydroxyethyl methacrylate below 5 mol %.

The radiation sensitive material comprising a copolymer including a unit structure expressed by the following general formula

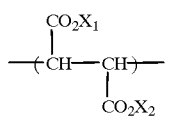

(where $X_1$, and $X_2$ represent —$C(CH_3)_2R_1$,

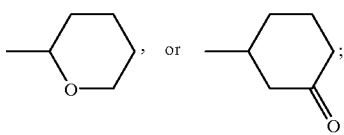

and $R_1$ represents alkyl group); and a unit structure generating an alkali soluble group in the presence of an acid, and an acid generating substance by application of radiation; and the radiation sensitive material comprising a copolymer expressed by the following general formula

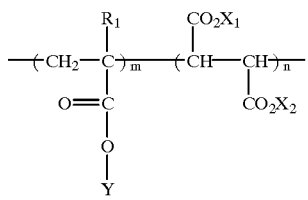

(where $X_1$ and $X_2$ represent —$C(CH_3)_2R_2$,

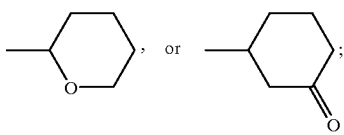

Y represents alicyclic group; $R_1$ represent $CH_3$ or H; and $R_2$ represents alkyl group); and an acid generating substance by application of radiation, both include a unit structure expressed by

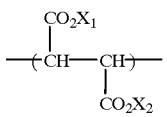

(where $X_1$ an $X_2$ represent —$C(CH_3)_2R_1$,

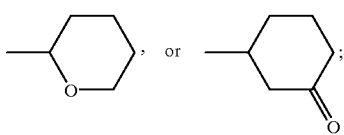

and $R_1$ represents alkyl group); whereby a larger number of sensitive groups are available per unit structure, with a result that higher sensitivity can be obtained, resulting in stable patterning characteristics.

The radiation sensitive material comprising a copolymer including a unit structure expressed by the following formula

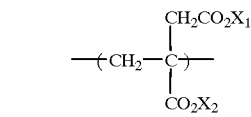

(where $X_1$ an $X_2$ represent —$C(CH_3)_2R_1$,

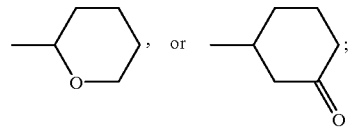

and
$R_1$ represents alkyl group); and a unit structure generating alkali soluble groups in the presence of an acid, and an acid generating substance by application of radiation; and the radiation sensitive material comprising a copolymer expressed by the following general formula

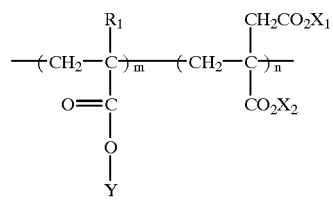

(where $X_1$ and $X_2$ represent —$C(CH3)_2R_2$,

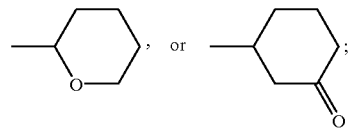

Y represents alicyclic group; $R_1$ represents $CH_3$ or H; and $R_2$ represents alkyl group); and an acid generating substance by application of radiation, both include a unit structure expressed by

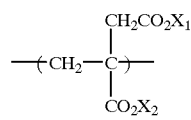

(where $X_1$ an $X_2$ represent —$C(CH_3)_2R_1$,

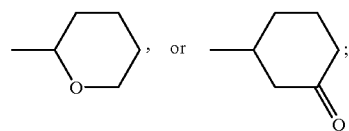

and $R_1$ represents alkyl group); whereby a larger number of sensitive groups is available per unit structure, and thus higher sensitivity and stable patterning characteristics can be obtained.

For more stable patterning characteristics, it is effective to improve adhesiveness. The presence of especially adamantyl groups and t-butyl groups, which are hydrocarbon, degrades adhesiveness. This is because hydrocarbon-based groups have such low polarity that there is no interaction with a substrate.

Accordingly the radiation sensitive material comprising a copolymer including a unit structure expressed by the following general formula

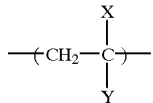

(where at least one of X and Y is nitrile group), and a unit structure generating alkali soluble groups in the presence of an acid, and an acid generating substance by application of radiation can have improved adhesiveness and stable patterning characteristics because of the nitrile groups, which have high polarity.

In the case that the unit structure including nitrile groups is acrylonitrile or methacrylonitrile, its content is preferably 10–70 mol %. When its content is below 10 mol %, sufficient adhesiveness cannot be obtained, and when its content is above 70 mol %, sufficient sensitivity can not be obtained.

A radiation sensitive material comprising a polymer expressed by a general formula

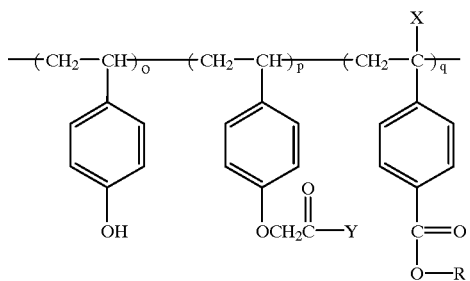

(where X represents H or $CH_3$;

R represents

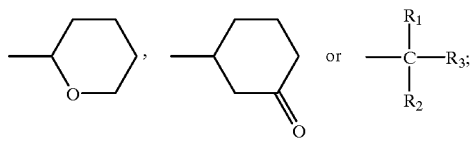

and $R_1$ and $R_2$ represent H, $R_3$ represents

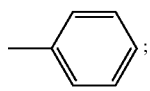

$R_1$ represents $CH_3$, $R_2$ represents H, $R_3$ represents

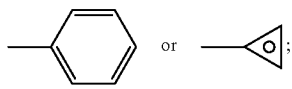

or $R_1$ and $R_2$ represent $CH_3$, $R_3$ represents

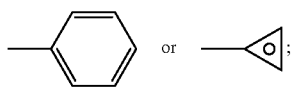

or $R_1$, $R_2$ and $R_3$ represents $CH_3$); containing hydrophilic groups and highly hydrophobic groups (e.g., adamantyl, norbornyl, cyclohexyl); and a substance generating an acid by application of radiation; and a radiation sensitive material comprising a copolymer which is expressed by a general formula

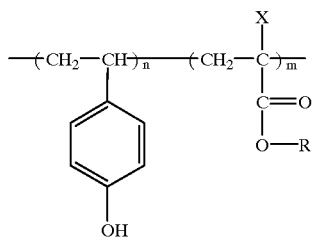

(where X represents H or $CH_3$;

R represents

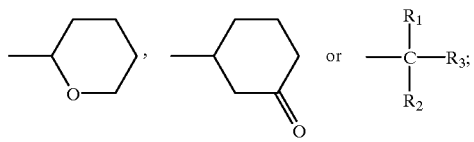

and $R_1$ and $R_2$ represent H, $R_3$ represents

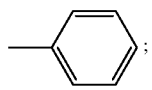

$R_1$ represents $CH_3$, $R_2$ represents H, $R_3$ represents

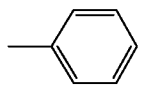

or

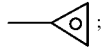

or $R_1$ and $R_2$ represent $CH_3$, $R_3$ represents

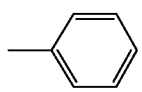

or

-continued

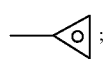

or $R_1$, $R_2$ and $R_3$ represents $CH_3$); or a copolymer containing hydrophilic groups and expressed by a general formula

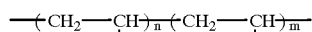

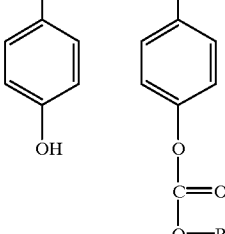

(where R represents a highly hydrophobic compound expressed by a general formula

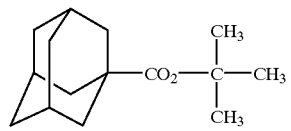

or by a general formula

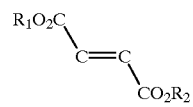

(where $R_1$ and $R_2$ represent

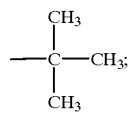

or $R_1$ represents

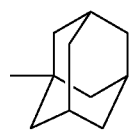

or

-continued

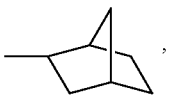

R represents

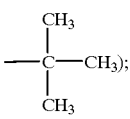

are inhibited by the highly hydrophobic groups from deactivation due to contaminants (amine, etc.) in environments from the exposure to the baking, and can have high sensitivity simply by changing photosensitive groups to a small amount of alkali soluble hydrophilic groups, so that resists especially those containing highly hydrophobic groups can be stably patterned.

Here, when the hydrophilic group-content copolymer contains an excessive ratio of vinylphenol expressed by the structural formula

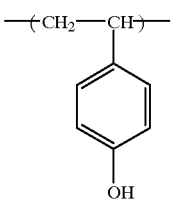

the copolymer is soluble in a developer, so that even unexposed parts are solved, and patterns cannot be formed. When the vinylphenol is contained by a too small ratio, resists cannot be well stripped so that stable patterning cannot be conducted. Thus it is preferred that the hydrophilic group-content copolymer expressed by a structural formula

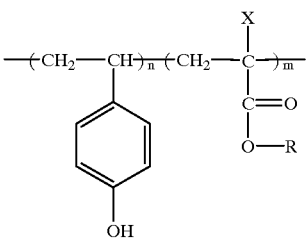

(where X represents H or $CH_3$;

R represents

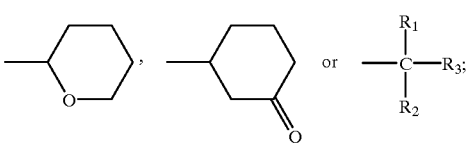

and $R_1$ and $R_2$ represent H, $R_3$ represents

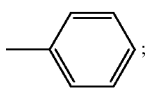

$R_1$ represents $CH_3$, $R_2$ represents H, $R_3$ represents

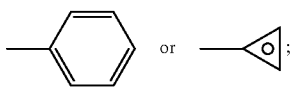

$R_1$ and $R_2$ represent $CH_3$, $R_3$ represents

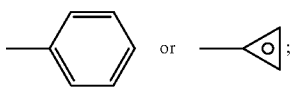

or $R_1$, $R_2$ and $R_3$ represent $CH_3$); contains vinylphenol by 50–70 mol %. It is preferred that the hydrophilic group-content copolymer expressed by the structural formula

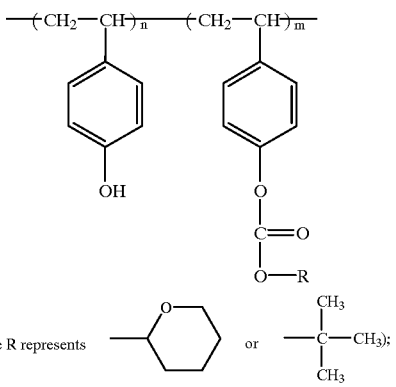

contains vinylphenol by 60–80 mol %.

By use of the radiation sensitive material comprising a copolymer including itaconic anhydride which is expressed by

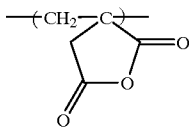

and a polymer as a unit structure which generates an alkali soluble group in the presence of an acid, and by use of a substance generating an acid by application of radiation, resists which have good adhesion can be formed. That is, because of the strong polarity of itaconic anhydride, adhesion of resists to substrates can be greatly improved.

Itaconic anhydride itself exhibits solubility to alkali, and has to be fed to use itaconic anhydride without impairing patterning characteristics. A feed amount of itaconic anhydride is preferably 5–50 mol % although this depends on compositions and structures of the polymer. With a feed amount of 5 mol % exclusive of 5 mol %, the adhesion cannot be improved. With a feed amount exceeding 50 mol %, the resist itself becomes alkali soluble, the unexposed part of the resist is also resolved, and patterning is impossible.

Feed of such alkali soluble groups is very effective to improve resolubility of the pattern, and good patterning characteristics can be obtained.

The copolymer containing itaconic anhydride has specific structures expressed by the general formula

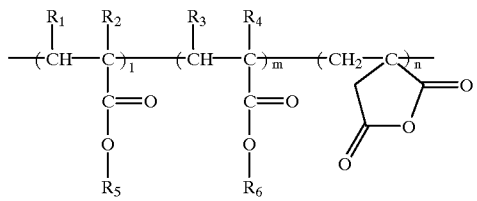

(where 1, m and n represent 0–60 mol %, 10–95 mol %, 5–50 mol % respectively; $R_1$, $R_2$, $R_3$ and $R_4$ represent H, halogen, $C_{1-4}$ alkyl group, $C_{1-4}$ substituted alkyl group, nitrile group, —$(CH_2)_n COOR_5$(n=0–1) or —$(CH_2)_n COOR_6$ (n=0–1); $R_5$ represents $C_{1-5}$ alkyl group, $C_{1-5}$ substituted alkyl group, alicyclic group, substituted alicyclic group, aromatic group or substituted aromatic group; and $R_6$ represents t-butyl group, t-amyl group, dimethylbenzyl group, tetrahydropyranyl group or 3-oxocyclohexyl group),

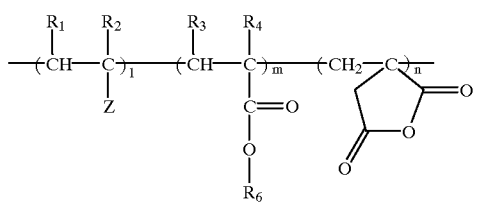

(where 1, m and n represent 1–95 mol %, 10–95 mol % and 5–50 mol %; Z represents benzene ring, substituted benzene ring, nitrile group, —$OR_7$, —$COR_7$ or —$OCOR_7$; $R_1$, $R_2$, $R_3$ and $R_4$ represent H, halogen, $C_{1-4}$ alkyl group, $C_{1-4}$ substituted alkyl group, nitrile group, -$C(CH_2)_n COOR_5$(n= 0–1), or —$(CH_2)_n COOR_6$(n=0–1); $R_6$ represents t-butyl group, t-amyl group, dimethylbenzyl group, tetrahydropyranyl group or 3-oxocyclohexyl group; $R_7$ represents a $C_{1-5}$ alkyl group, $C_{1-5}$ substituted alkyl group, alicyclic group, substituted alicyclic group, aromatic group or substituted aromatic group),

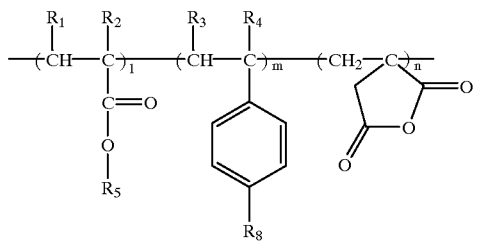

(where 1, m and n represent 0–95 mol %, 1–95 mol % and 5–50 mol %; Z represents benzene ring, substituted benzene ring, nitrile group, $OR_7$, —$COR_7$ or —$OCOR_7$; $R_1$, $R_{21}$ $R_3$ and $R_4$ represent H, halogen, $C_{1-4}$ alkyl group, $C_{1-4}$ substituted alkyl group, nitrile group, —$(CH_2)_n COOR_5$(n=0–1) or —$(CH_2)_nCOOR_6(n=0-1)$; and $R_8$ represents —OtBu, —OCOOtBu, or —COOt-Amyl),

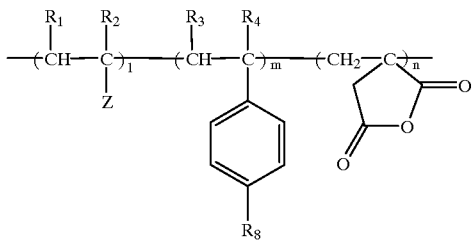

(where 1, m and n represent 0–95 mol %, 1–95 mol % and 5–50 mol %; Z represents benzene ring, substituted benzene ring, nitrile group, $OR_7$, —$COR_7$ or —$OCOR_7$; $R_1$, $R_2$, $R_3$ and $R_4$ represent H, halogen, $C_{1-4}$ alkyl group, $C_{1-4}$ substituted alkyl group, nitrile group, —$(CH_2)_nCOOR_5(n=0-1)$ or —$(CH_2)_nCOOR_6(n=0-1)$; and $R_8$ represents —OtBu, —OCOOtBu, or —COOt-Amyl), or other structures.

Here the so-called alicyclic group is adamantyl, norbornyl, cyclohexyl, a substance partially having tricyclo [5.2.1.0] decane skeleton or others, but is not limited to them.

Groups generating alkali soluble groups in the presence of an acid are t-butyl ester, t-amyl ester, t-butyl ether, t-BOC, tetrahydropyranyl, tetrahydropyranyl ether, 3-oxocyclohexyl ester or dimethylbenzyl ester, but is not limited to them.

That is, a resist is formed of the above-described radiation sensitive material, and the resist is applied onto a substrate to be processed, prebaked, exposed, postbaked and developed, and is subjected to other treatments, whereby a submicron dimension pattern can be formed stably.

To obtain more stable patterning characteristics, it is necessary to improve developers. Chemical amplifying resists have the intrinsic problem that protonic acid becomes inactive on the surface layers due to contamination by environmental amine, etc. Consequently solubility differences take place between the surface and inner layers, which is a serious factor that hinders stable patterning. Especially adamantyl groups, t-butyl groups, etc., Hydrocarbons, which are very hydrophobic, especially adamantyl groups, t-butyl groups, etc., are effective to hinder dissolution in developers, and are very effective at making the surface insoluble.

Accordingly, a mixed liquid of an organic alkaline aqueous solution and isopropyl alcohol is used as a developer, whereby solubility is much improved and smaller solubility differences between the surface and inner layers can be obtained, so allowing stable patterning. Isopropyl alcohol is the most effective alcohol to be added as methanol and ethanol cause cracks, and peelings are found. The use of this liquid mixture developer raised the sensitivity by one or more places and reduced strain caused upon development, so that the adhesiveness was much improved.

It is preferable that the developer contains isopropyl alcohol by 5–95 volt. This is because content of isopropyl alcohol by below 5 mol % does not improve the sensitivity, and content above 95 mol % easily causes cracks and crazes.

A polymer containing an acrylic or methacrylic ester unit, each having an alicyclic group and a polar structure at an ester unit, has such a high base polymer polarity that the very high hydrophobicity due to the alicyclic group can be lowered. As a result, polarity differences occur between the polymer and the hydrocarbon-based protecting film, and the protecting film can be applied without resolving the resist film, whereby a pattern of a desired size can be formed.

Examples of substances having high polarity structures are ketone, alcohol, ether, ester, carbonic acid, an acid anhydride, or any one of these substances having some of the atoms of their polar structure replaced by sulfur, nitrogen or halogen atoms, but is not limited to them.

The ratio of feed of the materials having polar structures must be at least 1–50 mol %, preferably 20% or greater.

Although the resist containing itaconic anhydride contains highly hydrophobic hydrocarbon groups, the resist permits hydrocarbon-based polymers, which have not been conventionally applied to the resist as a protecting film because of the high polarity of itaconic anhydride.

Formation of such protecting films on the resist can avoid the problem of PED (Post Exposure Delay), which is characteristic of chemical width increment resists.

A high molecular weight hydrocarbon-based solvent is used as the solvent for application of the protecting film, so that the protecting film can be applied with higher accuracy. Application solvents with too low a boiling point make it difficult to uniformly apply the protecting film on wafers. Preferably solvents have boiling points above 100° C. are used. Examples of preferable solvents are limonene, 1,5-cyclooctadiene, 1-decene, t-butylcyclohexane, p-cymene, dodecylbenzene, etc.

The hydrocarbon polymer is, for example, olefine, diene, etc. but is not limited to them as long as the hydrocarbon polymers are transparent to exposure wavelengths and are soluble in the above-mentioned solvent.

The alicyclic group is, for example, cyclohexane, norbornane, adamantyl, and substances having a tricyclo [5.2.1.0].decane skeleton, but is not limited to them.

DETAILED DESCRIPTION OF THE PREFERRED EMBODIMENTS

An example of the semiconductor fabrication method according to the present invention will be explained with reference to FIGS. 1, and 2A to 2G.

Figure 1:
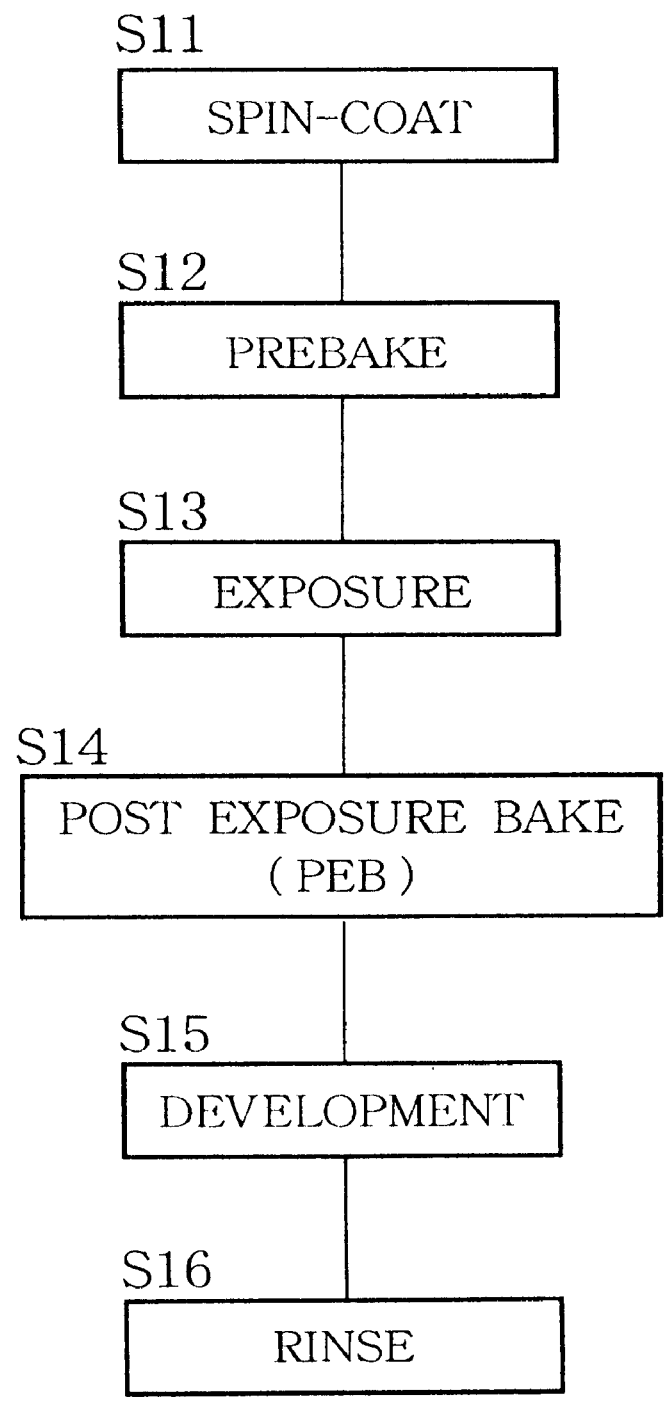
FIG. 1 is the flow chart of one example of the semiconductor fabrication method according to the present invention.
Figure 2A:
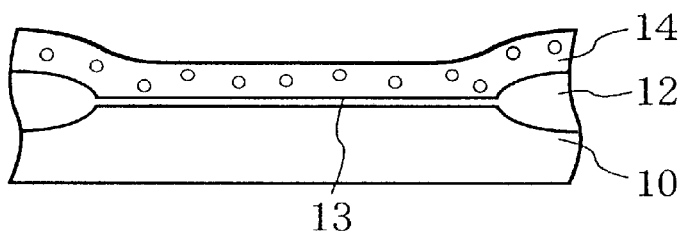
FIGS. 2A to 2G are sectional views of a semiconductor device in the steps of one example of the semiconductor fabrication method according to the present invention.
Figure 2B:
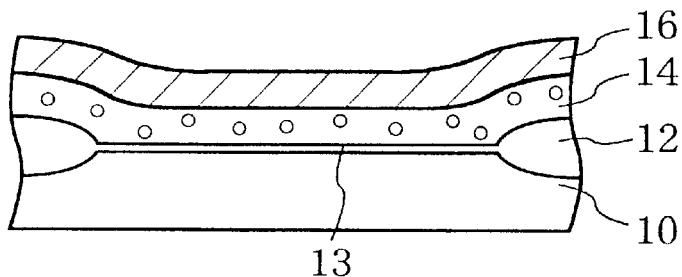

In patterning a polycrystalline silicon film 14 deposited through an oxide film 13 on a semiconductor substrate 10 with a field isolation 12 formed on as shown in FIG. 2A, a resist film 16 is applied to the semiconductor substrate 10 with a polycrystalline silicon film 14 formed on (Step S11), and prebaked (Step S12) (FIG. 2B).

Figure 2C:
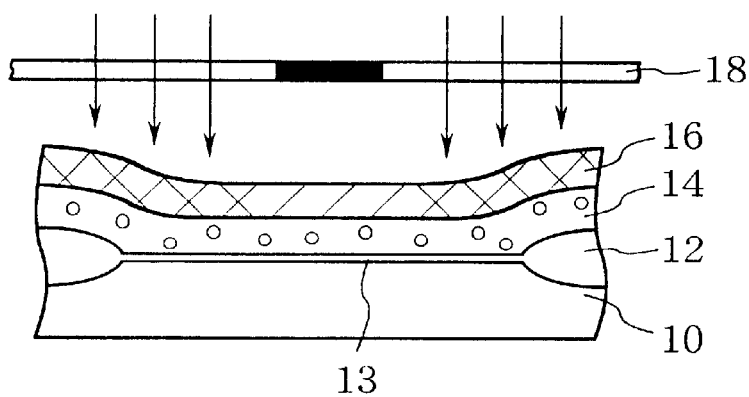

Then, the semiconductor substrate 10 with the resist film 16 deposited on is exposed through a mask 18 for selective exposure (Step S13, FIG. 2C).

Figure 2D:
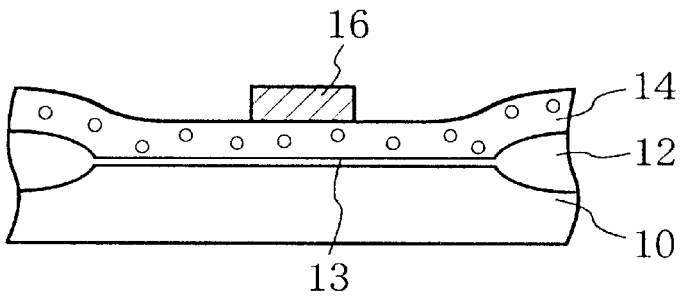

Following postbake (Step S14), the resist film 16 is developed with a developer (Step S15) and patterned. Subsequently the semiconductor substrate 10 is rinsed with deionized water (Step S16). Thus the patterned resist film 16 is formed on the semiconductor substrate 10 (FIG. 2D).

Figure 2E:
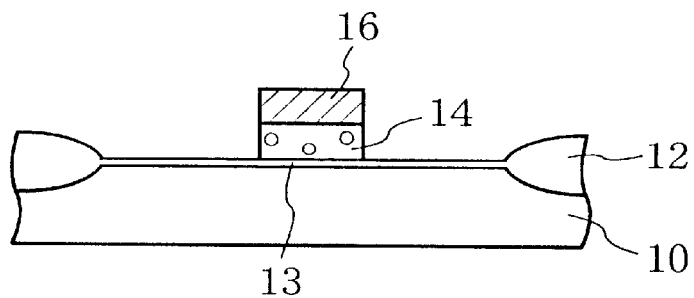

Then, with the patterned resist film 16 as a mask, the polycrystalline silicon film 14 is etched by reactive ion etching (FIG. 2E).

Figure 2F:
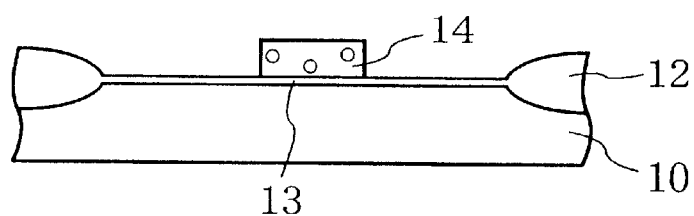

Next, the resist film 16 is removed, and the patterning of the polycrystalline silicon film 14 is completed (FIG. 2F).

Figure 2G:
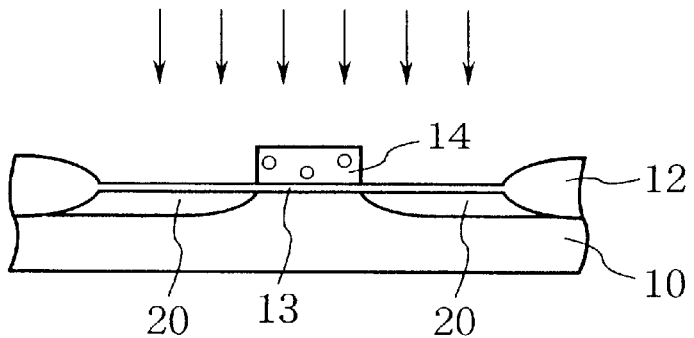
Figure 3:
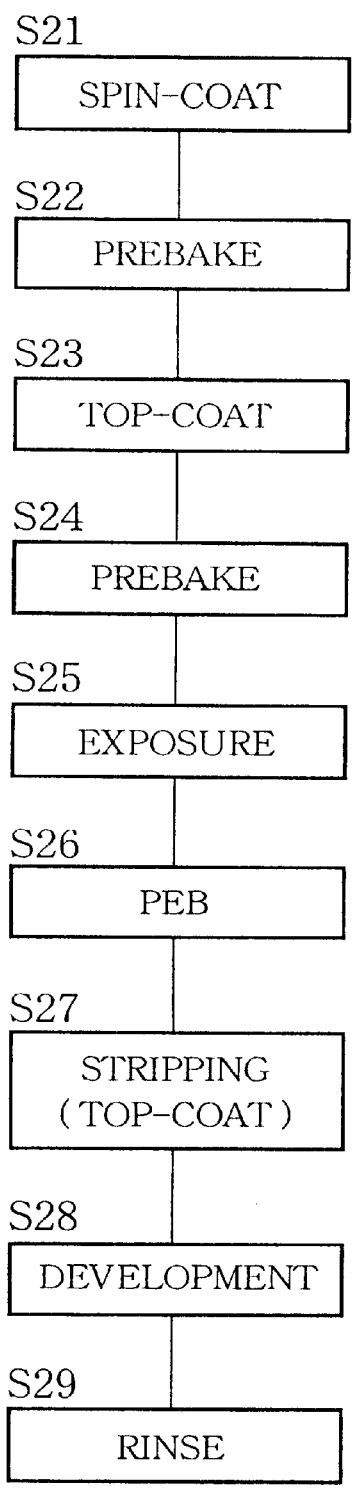
FIG. 3 is the flow chart of another example of the semiconductor fabrication method according to the present invention.

Subsequently ion implantation is conducted with the polycrystalline silicon film 14 as a mask to form a source/drain diffusion 20, and a MOS transistor including the polycrystalline silicon film 14 as a gate electrode is fabricated (FIG. 2G).

Another example of the semiconductor fabrication method according to the present invention will be explained with reference to FIGS. 3, and 4A to 4H.

Figure 4A:
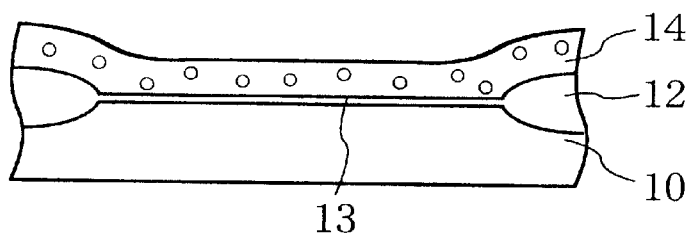
FIGS. 4A to 4H are sectional views of a semiconductor device in the steps of another example of the semiconductor fabrication method according to the present invention.
Figure 4B:
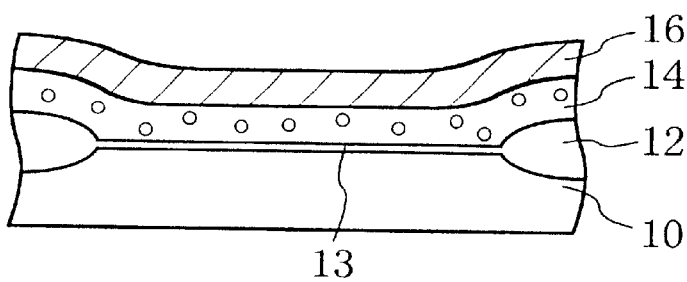

In patterning a polycrystalline silicon film 14 deposited through an oxide film 13 on a semiconductor substrate 10 with a field isolation 12 formed on as shown in FIG. 4A, a resist film 16 is applied to the semiconductor substrate 10 with a polycrystalline silicon film 14 formed on (Step S21), and prebaked (Step S22, FIG. 4B).

Figure 4C:
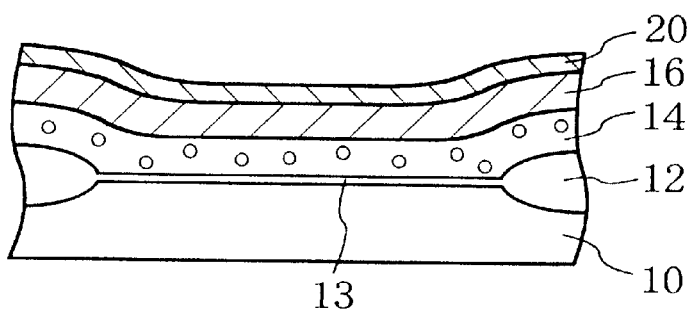

Next, a protecting film 20 (top coat) is applied onto the semiconductor substrate 10 by spin coating (step S23), and prebaked (Step S24, FIG. 4C)

Figure 4D:
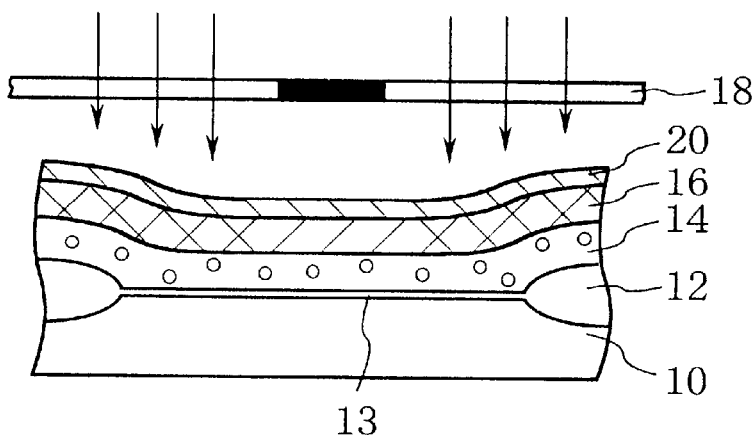

Then, the semiconductor substrate 10 with the resist film 16 and the protecting film 20 deposited on is exposed through a mask 18 for selective exposure (Step S25, FIG. 4D).

Figure 4E:
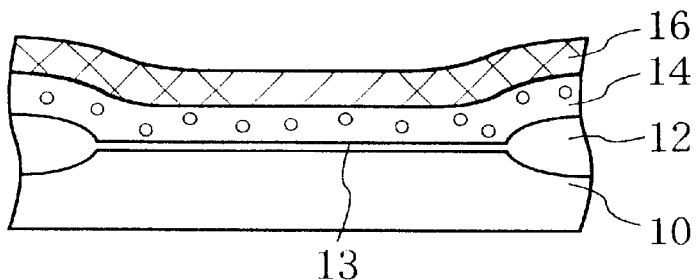

Following postbake (Step S26), chemical solution which can dissolve the protecting film 20 is applied onto the semiconductor substrate 10 by spin coating, and the protecting film 20 is stripped (Step S27, FIG. 4E).

Figure 4F:
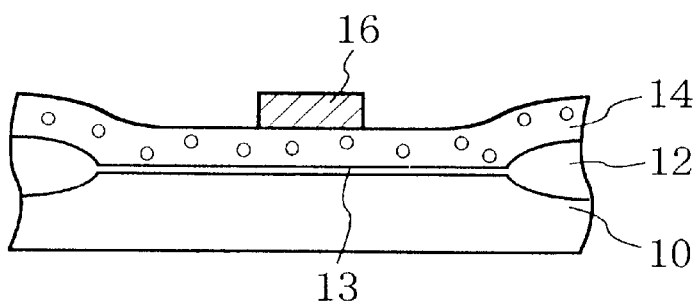

Next, the resist film 16 is developed with a developer (Step S28) and patterned. Subsequently the semiconductor substrate 10 is rinsed with deionized water (Step S29). Thus the patterned resist film 16 is formed on the semiconductor substrate 10 (FIG. 4F).

Figure 4G:
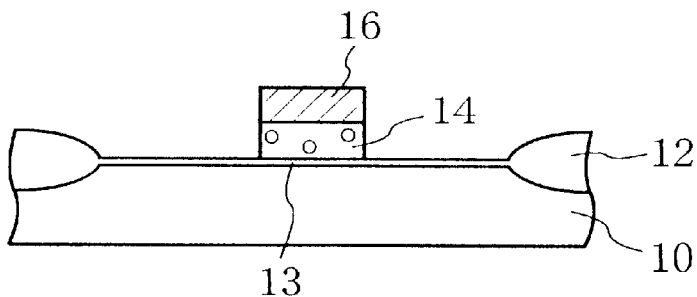

Then, with the patterned resist film 16 as a mask, the polycrystalline silicon film 14 is etched by reactive ion etching (FIG. 4G).

Figure 4H:
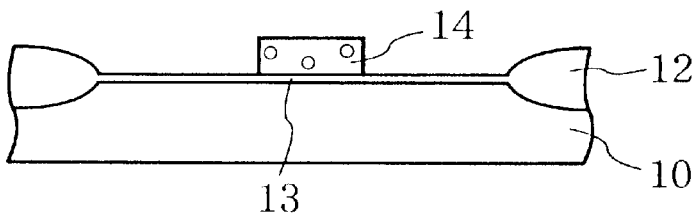

Next, the resist film 16 is removed, and the patterning of the polycrystalline silicon film 14 is completed (FIG. 4H).

As described above, subsequently ion implantation is conducted with the polycrystalline silicon film 14 as a mask to form a source/drain diffusion 20, and a MOS transistor including the polycrystalline silicon film 14 as a gate electrode is fabricated.

Accordingly micronized semiconductor device can be fabricated by excimer laser lithography, which can provide highly sensitive, stable patterning characteristics.

EXAMPLE 1

Adamantyl methacrylate monomer, and t-butyl acrylate monomer were loaded by 1:1, and a 5 mol/l toluene solution was prepared. 20 mol % of AIBN (azoisobutylo nitrile) expressed by the following structural formula

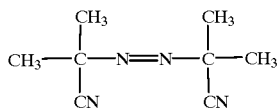

was added as a polymerization initiator. Then polymerization was reacted at 80° C. for 8 hours, and precipitation purification followed. And a copolymer expressed by the following structural formula

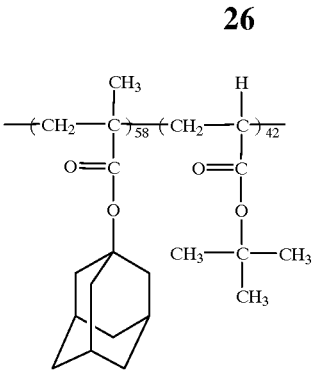

and having a 58:42 composition ratio, a 5100 weight-averaged molecular weight (Mw) and a 1.43 (Mw/Mn) was prepared. A thermal analysis showed that the glass transition temperature of this polymer was 126° C.

Then triphenylsulfonium hexafluoroantimonate expressed by the following structural formula

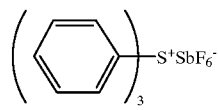

was added as an acid generating substance by 15 wt % to the thus-synthesized copolymer, and a cyclohexanone solution was prepared. This solution was applied by spin coating in a 0.7 µm-thickness onto a wafer coated with hard-baked novolak resin, and prebaked for 100 seconds on a hot plate at 60° C.

The thus-prepared resist film on the wafer was exposed by KrF excimer stepper (by Nikon, NA=0.45) and then was subjected to PEB (Post Exposure Bake) at 100° C. for 60 seconds. Subsequently the resist was developed for 60 seconds by NMD-3 (by Tokyo Ohka), which is an alkaline aqueous solution and rinses by deionized water for 30 seconds. A threshold energy Eth of the radiation dose for this exposure was 50 mJ/cm². A 0.45 µm-wide L & S (line and space) pattern was formed at a 130 mJ/cm² radiation dose.

EXAMPLE 2

Adamantyl acrylate monomer and t-butyl methacrylate monomer were loaded by 1:1, and a 5 mol/l toluene solution was prepared. 20 mol % of AIBN (azoisobutylo nitrile) was added as a polymerization initiator. Then polymerization was reacted at 80° C. for 8 hours, and precipitation purification followed. And a copolymer expressed by the following structural formula

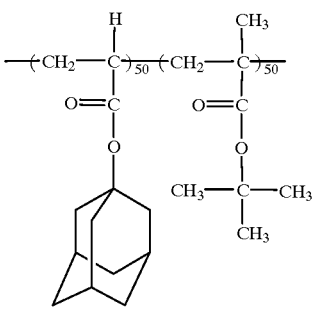

and having a 50:50 composition ratio, a 4180 weight-averaged molecular weight and a 1.59 degree of dispersion was prepared. A thermal analysis showed that the glass transition temperature of this polymer was 94° C.

Then triphenylsulfonium hexafluoroantimonate expressed by the following structural formula

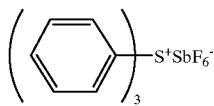

was added as an acid generating substance by 15 wt % to the thus-synthesized copolymer, and a cyclohexanone solution was prepared. This solution was applied by spin coating in a 0.7 μm-thickness onto a wafer coated with hard-baked novolak resin, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds by NMD-3, which is an alkaline aqueous solution and rinsed by deionized water for 30 seconds. A threshold energy Eth of the radiation dose for this exposure was 81 mJ/cm². A 0.50 μm-wide L & S pattern was formed.

EXAMPLE 3

Adamantyl acrylate monomer, and t-butyl acrylate monomer were loaded by 1:1, and a 5 mol/l toluene solution was prepared. 20 mol % of AIBN was added as a polymerization initiator. Then polymerization was reacted at 80° C. for 8 hours, and precipitation purification with methanol followed. And a copolymer expressed by the following structural formula

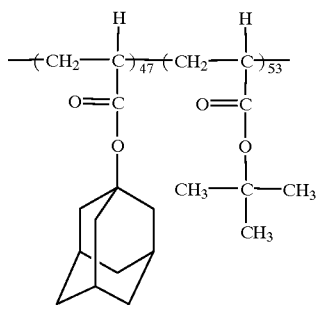

and having a 47:53 composition ratio, a 4610 weight-average molecular weight and a 1.83 degree of dispersion was prepared. A thermal analysis showed that the glass transition temperature of this polymer was 72° C.

Then triphenylsulfonium hexafluoroantimonate expressed by the following structural formula

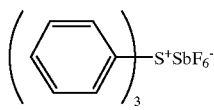

was added as an acid generating substance by 15 wt % to the thus-synthesized copolymer, and a cyclohexanone solution was prepared. This solution was applied by spin coating in a 0.7 μm-thickness onto a wafer coated with hard-baked novolak resin, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds by NMD-3, which is an alkaline aqueous solution and rinsed by deionized water for 30 seconds. A threshold energy Eth of the radiation dose for this exposure was 37 mJ/cm². A 0.50 μm-wide L & S pattern was formed.

[Control 1]

Adamantyl methacrylate monomer, and t-butyl methacrylate monomer were loaded by 1:1, and a 5 mol/l toluene solution was prepared. 20 mol % of AIBN was added as a polymerization initiator. Then polymerization was reacted at 80° C. for 8 hours, and precipitation purification followed. And a copolymer expressed by the following structural formula

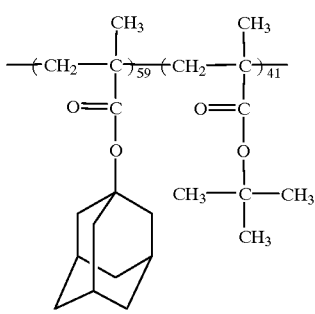

and having a 59:41 composition ratio, a 3351 weight-average molecular weight and a 1.31 degree of dispersion was prepared. No glass transition temperature of this polymer was found by a thermal analysis.

Then triphenylsulfonium hexafluoroantimonate expressed by the following structural formula

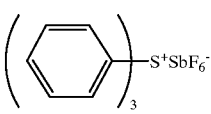

was added as an acid generating substance by 15 wt % to the thus-synthesized copolymer, and a cyclohexanone solution was prepared. This solution was applied by spin coating in a 0.7 μm-thickness onto a wafer coated with hard-baked novolak resin, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds by NMD-3, which is an alkaline aqueous solution and rinsed by deionized water for 30 seconds. The development did not advance, and no pattern was formed.

[Control 2]

Adamantyl methacrylate monomer, and t-butyl methacrylate monomer were loaded by 1:1, and a 5 mol/l toluene solution was prepared. 20 mol % of AIBN was added as a polymerization initiator. Then polymerization was reacted at 80° C. for 8 hours, and precipitation purification followed. And a copolymer expressed by the following structural formula

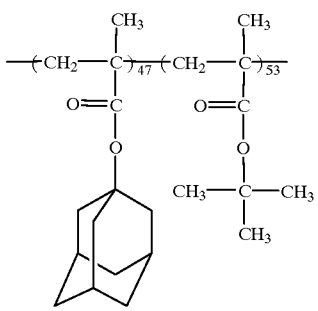

and having a 47:53 composition ratio, a 19000 weight-averaged molecular weight and a 1.51 degree of dispersion was prepared. No glass transition temperature of this polymer was found by a thermal analysis.

Then triphenylsulfonium hexafluoroantimonate expressed by the following structural formula

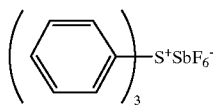

was added as an acid generating substance by 15 wt % to the thus-synthesized copolymer, and a cyclohexanone solution was prepared. This solution was applied by spin coating in a 0.7 µm-thickness onto a wafer coated with hard-baked novolak resin, and prebaked for 100 seconds on a hot plate of 60° C.

The thus-prepared resist film on the wafer was exposed by KrF excimer stepper and then was subjected to PEB at 100° C. for 60 seconds Subsequently the resist was developed for 60 seconds by NMD-3, which is an alkaline aqueous solution and rinsed by deionized water for 30 seconds. An exposed region was reduced to about 10% at a radiation dose of 102 mJ/cm2, but the residual film did not disappear even at higher exposures.

EXAMPLE 4

Dimethyladamantyl acrylate monomer, and t-butyl methacrylate monomer were loaded by 1:1, and a 5 mol/l toluene solution was prepared. 20 mol % of AIBN (azoisobutylo nitrile) was added as a polymerization initiator. Then polymerization was reacted at 80° C. for 8 hours, and precipitation purification followed. And a copolymer expressed by the following structural formula

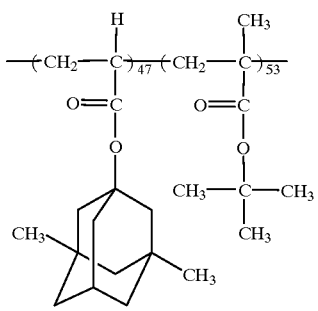

and having a 47:53 composition ratio, a 3650 weight-averaged molecular weight and a 1.64 degree of dispersion was prepared. A thermal analysis showed that the glass transition temperature of this polymer was 66° C.

Then triphenylsulfonium hexafluoroantimonate expressed by the following structural formula

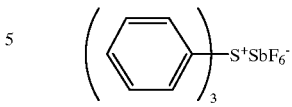

was added as an acid generating substance by 15 wt % to the thus-synthesized copolymer, and a cyclohexanone solution was prepared. This solution was applied by spin coating in a 0.7 µm-thickness onto a wafer coated with hard-baked novolak resin, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds by NMD-3, which is an alkaline aqueous solution and rinsed by deionized water for 30 seconds. A threshold energy Eth of the radiation dose for this exposure was 81 mJ/cm$^2$. A minimum resolution was a 0.35 µm-wide L & S.

EXAMPLE 5

Dimethyladamantyl acrylate monomer, and t-butyl acrylate monomer were loaded by 1:1, and a 5 mol/l toluene solution was prepared. 20 mol % of AIBN (azoisobutylo nitrile) was added as a polymerization initiator. Then polymerization was reacted at 80° C. for 8 hours, and precipitation purification followed. And a copolymer expressed by the following structural formula

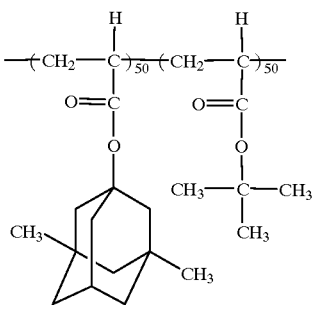

and having a 50:50 composition ratio, a 4050 weight-averaged molecular weight and a 1.71 degree of dispersion was prepared. A thermal analysis showed that the glass transition temperature of this polymer was 47° C.

Then triphenylsulfonium hexafluoroantimonate expressed by the following structural formula

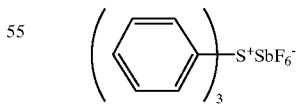

was added as an acid generating substance by 15 wt % to the thus-synthesized copolymer, and a cyclohexanone solution was prepared. This solution was applied by spin coating in a 0.7 µm-thickness onto a wafer coated with hard-baked novolak resin, and prebaked for 100 seconds on a hot plate of 60° C.

The thus-prepared resist film on the wafer was exposed by KrF excimer stepper and then was subjected to PEB at 100°

C. for 60 seconds. Subsequently the resist was developed for 60 seconds by NMD-3, which is an alkaline aqueous solution and rinsed by deionized water for 30 seconds. A threshold energy Eth of the radiation dose for this exposure was 81 mJ/cm$_2$. A minimum resolution was a 0.30 μm-wide L & S.

[Control 3]

Adamantyl methacrylate monomer, and t-butyl methacrylate monomer were loaded by 3:7, and a 5 mol/l toluene solution was prepared. 20 mol % of AIBN (azoisobutylo nitrile) was added as a polymerization initiator. Then polymerization was reacted at 80° C. for 8 hours, and precipitation purification followed. And a copolymer expressed by the following structural formula

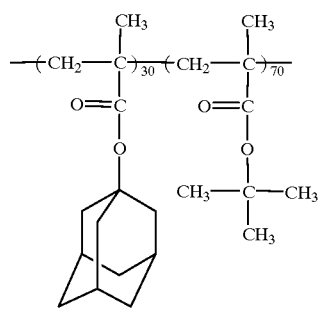

and having a 30:70 composition ratio, a 8400 weight-averaged molecular weight and a 1.61 degree of dispersion was prepared. No glass transition temperature of this polymer was not found by a thermal analysis.

Then triphenylsulfonium hexafluoroantimonate expressed by the following structural formula

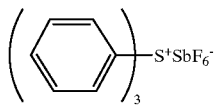

was added as an acid generating substance by 15 wt % to the thus-synthesized copolymer, and a cyclohexanone solution was prepared. This solution was applied by spin coating in a 0.7 μm-thickness onto a wafer coated with hard-baked novolak resin, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds by NMD-3, which is an alkaline aqueous solution and rinsed by deionized water for 30 seconds. A threshold energy Eth of the radiation dose for this exposure was 81 mJ/cm$^2$. A minimum resolution was a 0.50 μm-wide L & S, and smaller patterns peeled off and could not be found.

EXAMPLE 6

Adamantyl methacrylate monomer, t-butyl methacrylate monomer and methacrylic acid were loaded by 2:1:1.0.5 mol/l 1,4-dioxane solution was used, and 20 mol % of AIBN was added as a polymerization initiator. Then polymerization was reacted at 80° C. for 8 hours, and precipitation purification with n-hexane followed. And a terpolymer expressed by the following structural formula

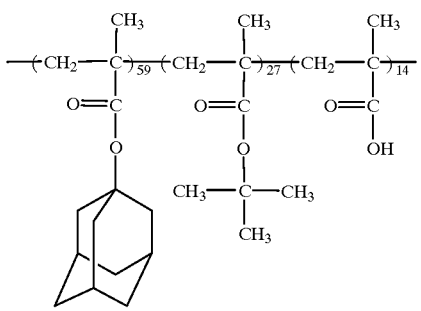

and having a 59:27:14 composition ratio, a 6242 weight-averaged molecular weight and a 2.14 degree of dispersion was prepared.

Then triphenylsulfonium hexafluoroantimonate expressed by the following structural formula

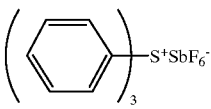

was added as an acid generating substance by 15 wt % to the thus-synthesized copolymer, and a cyclohexanone solution was prepared. This solution was applied by spin coating in a 0.7 μm-thickness onto a wafer coated with hard-baked novolak resin, and prebaked for 100 seconds on a hot plate.

The thus-prepared resist film on the wafer was exposed by KrF excimer stepper and then was subjected to PEB at 100° C. for 60 seconds. Subsequently the resist was developed for 60 seconds by NMD-3, which is an alkaline aqueous solution and rinsed by deionized water for 30 seconds. A threshold energy Eth of the radiation dose for this exposure was 100 mJ/cm$^2$. A 0.45 μm-wide L & S pattern was formed.

EXAMPLE 7

A profile of the 1 μm hole pattern prepared according to Example 6 was observed. The result of the observation was no unsolved superficial layer was found. Even when the resist film was exposed and then left for 45 minutes, and was subjected to PEB, the pattern was not formed. [Control 4]

Adamantyl methacrylate monomer, and t-butyl acrylate monomer were loaded by 1:1, and 5 mol/l toluene solution was prepared. 20 mol % of AIBN was added as a polymerization initiator. The polymerization was reacted for about 8 hours at 80° C. The polymerization was followed by precipitation purification with methanol. Resultantly a copolymer expressed by

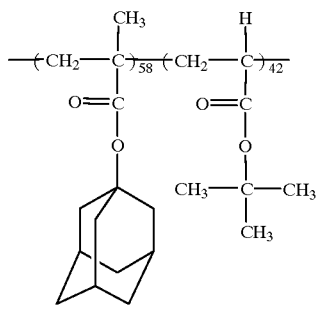

and having a composition ratio of 59:42, a 5100 weight-average molecular weight, and a 1.43 degree of dispersion was prepared. The glass transition temperature of this copolymer given by thermal analysis was 126° C.

Then triphenylsulfonium hexafluoroantimonate expressed by the following structural formula

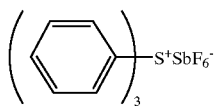

was added as an acid generating substance by 15 wt % to the thus-synthesized copolymer, and a cyclohexanone solution was prepared. This solution was applied by spin coating in a 0.7 $\mu$m-thickness onto a wafer coated with hard-baked novolak resin, and prebaked for 100 seconds on a hot plate.

The thus-prepared resist film on the wafer was exposed by KrF excimer stepper and then was subjected to PEB at 100° C. for 60 seconds. Subsequently the resist was developed for 60 seconds by NMD-3, which is an alkaline aqueous solution and rinsed by deionized water for 30 seconds. A threshold energy Eth of the radiation dose for this exposure was 50 J/cm$^2$. A 0.45 $\mu$m wide L & S pattern was formed at 130 mJ/cm$^2$. The profile of a 1 $\mu$m hole pattern had "eaves" of an unsolved superficial layer.

[Control 5]

In Control 4, after the exposure, the resist film was left for 45 minutes and was subjected to PEB. A substantially upper half of the pattern was covered with the superficial unsolved layer. Accordingly the pattern could not be formed.

EXAMPLE 8

Adamantyl methacrylate monomer, t-butyl methacrylate monomer and methacrylic acid were loaded by 2:1:1, and 0.5 mol/l 1,4-dioxane solution was prepared. 20 mol % of AIBN was added as a polymerization initiator. Then polymerization was reacted at 80° C. for about 8 hours, and precipitation purification with n-hexane followed. And a terpolymer expressed by the following structural formula

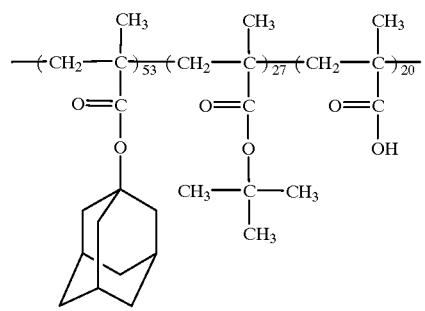

and having a 53:27:20 composition ratio, a 4523 weight-averaged molecular weight and a 1.92 degree of dispersion was prepared.

Then triphenylsulfonium hexafluoroantimonate expressed by the following structural formula

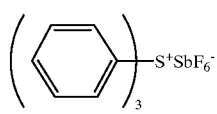

was added as an acid generating substance by 15 wt % to the thus-synthesized copolymer, and a cyclohexanone solution was prepared. This solution was applied by spin coating in a 0.7 $\mu$m-thickness onto a wafer coated with hard-baked novolak resin, and prebaked for 100 seconds on a hot plate of 130° C.

The thus-prepared resist film on the wafer was exposed by KrF excimer stepper and then was subjected to PEB at 130° C. for 60 seconds. Subsequently the resist was immersed for 90 seconds in an NMD-3 solution, an alkaline aqueous solution, diluted by a 20-time amount of deionized water and developed, and then rinsed with deionized water for 30 seconds. The threshold energy Eth of the radiation dose for this exposure was 57 mJ/cm$^2$. A 0.30 $\mu$m-wide L & S pattern was formed.

[Control 6]

Adamantyl methacrylate monomer, t-butyl methacrylate monomer and methacrylic acid were loaded by 2:1:4, and 0.5 mol/l 1,4-dioxane solution was prepared. 20 mol % of AIBN was added as a polymerization initiator. Then polymerization was reacted at 80° C. for about 8 hours, and precipitation purification with n-hexane followed. And a terpolymer expressed by the following structural formula

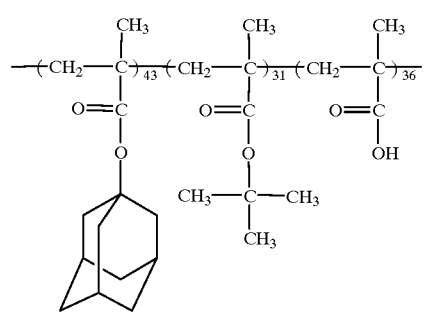

and having a 43:31:36 composition ratio, a 4115 weight-averaged molecular weight and a 1.95 degree of dispersion was prepared.

Then triphenylsulfonium hexafluoroantimonate expressed by the following structural formula

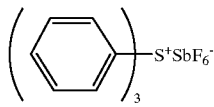

was added as an acid generating substance by 15 wt % to the thus-synthesized copolymer, and a cyclohexanone solution was prepared. This solution was applied by spin coating in a 0.7 μm-thickness onto a wafer coated with hard-baked novolak resin, and prebaked for 100 seconds on a hot plate of 130° C.

The thus-prepared resist film on the wafer was exposed by KrF excimer stepper and then was subjected to PEB at 130° C. for 60 seconds. Subsequently the resist was immersed for 90 seconds in an NMD-3 solution, an alkaline solution, diluted by a 20-time amount of deionized water, and the resist film disappeared.

EXAMPLE 9

To adamantyl methacrylate-t-butyl methacrylate-hydroxyethyl methacrylate terpolymer expressed by the following structural formula

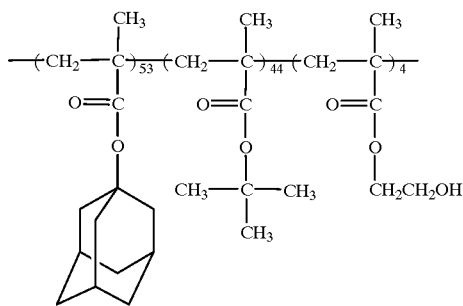

and having a composition ratio of 53:44:4, a 8800 weight-average molecular weight and a 1.84 degree of dispersion, 15 wt % of triphenylsulfonium hexafluoroantimonate expressed by the following structural formula

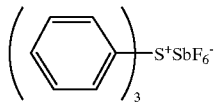

was added as an acid generating substance to prepare a cyclohexanone solution. This solution was applied to an Si wafer treated with HMDS (hexamethyldisilazane) and then baked on a hot plate of 60° C. for 100 seconds. And a 0.65 μm-thickness resist film was prepared.

The thus-prepared resist film was exposed by a KrF excimer stepper and was subjected to PEB at 130° C. for 60 seconds. Subsequently the resist film was developed with an aqueous solution of 2.38% of TMAH (tetramethyl ammonium hydroxide). The radiation dose for this exposure was 110 mJ/cm$^2$. A 0.4 μm-wide L & S pattern was resolved.

EXAMPLE 10

To adamantyl methacrylate-t-butyl methacrylate-hydroxyethyl methacrylate terpolymer expressed by the following structural formula

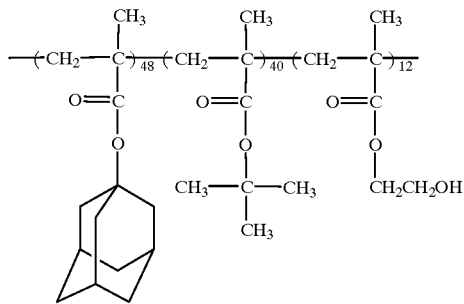

and having a composition ratio of 48:40:12, a 8400 weight-average molecular weight and a 1.94 degree of dispersion, 15 wt % of triphenylsulfonium hexafluoroantimonate expressed by the following structural formula

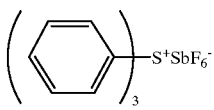

was added as an acid generating substance to prepare a cyclohexanone solution. This solution was applied to an Si wafer treated with HMDS (hexamethyldisilazane) and then baked on a hot plate of 60° C. for 100 seconds. And a 0.65 m-thickness resist film was prepared.

The thus-prepared resist film was exposed by a KrF excimer stepper and was subjected to PEB at 130° C. for 60 seconds. Subsequently the resist film was developed with an aqueous solution of 2.38% of TMAH (tetramethylammonium hydroxide). The radiation dose for this exposure was 40 mJ/cm$^2$. A 0.4 μm-wide L & S pattern was resolved.

[Control 7]

To adamantyl methacrylate-t-butyl methacrylate copolymer expressed by the following structural formula

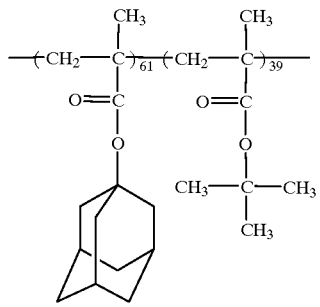

and having a composition ratio of 61:39, a 7900 weight-average molecular weight and a 1.82 degree of dispersion, 15 wt % of triphenylsulfonium hexafluoroantimonate expressed by the following structural formula

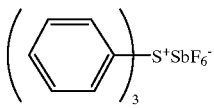

was added as an acid generating substance to prepare a cyclohexanone solution. This solution was applied, by spin coating, to a wafer coated with hard-baked novolak and baked on a hot plate of 60° C. for 100 seconds. And a 0.65 μm-thickness resist film was formed.

The thus-prepared resist film was exposed by a KrF excimer stepper and was subjected to PEB at 100° C. for 60 seconds. Subsequently the resist film was developed with an aqueous solution of 2.38% of TMAH (tetramethylammonium hydroxide). The radiation dose for this exposure was 40 mJ/cm². A 0.4 μm-wide L & S pattern was resolved, but the pattern could not be reproduced.

EXAMPLE 11

Adamantyl methacrylate monomer, and di-t-butyl itaconate monomer were loaded by 1:3.20 mol % of MAIB (dimethyl 2,2-azoisobisbutylate) expressed by the following structural formula

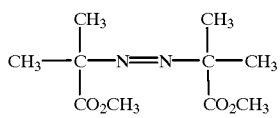

was added as a polymerization initiator. Then, bulk polymerization followed at 80° C. for about 3 hours. The polymerization was followed by precipitation purification with methanol.

Resultantly the copolymer expressed by the following structural formula

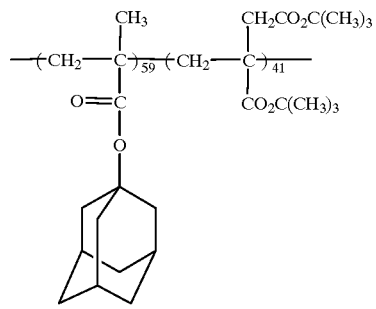

and having a composition ratio of 59:41, a weight-average molecular weight of 9357 and a 2.44 degree of dispersion was prepared.

Then triphenylsulfonium hexafluoroantimonate expressed by the following structural formula

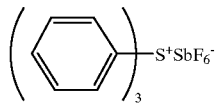

was added as an acid generating substance by 15 wt % to the thus-synthesized copolymer, and a cyclohexanone solution was prepared. This solution was applied, in a 0.7 μm-thickness by spin coating, to an HMDS treated Si wafer, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds with NMD-3, which is a alkaline aqueous solution, and then rinsed with deionized water for 30 seconds. The threshold energy Eth of the radiation dose for this exposure was 5.6 mJ/cm². A resolution was a 0.7 μm-wide L & S pattern.

[Control 8]

Adamantyl methacrylate monomer, and t-butyl acrylate monomer were loaded by 1:1.20 mol % of MAIB expressed by the following structural formula

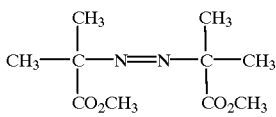

was added as a polymerization initiator. Then, bulk polymerization followed at 80° C. for about 3 hours with toluene as a reaction solvent. The polymerization was followed by precipitation purification with methanol.

Resultantly the copolymer expressed by the following structural formula

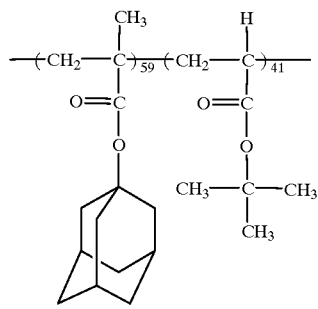

and having a composition ratio of 59:41, a weight-average molecular weight of 6061 and a 1.24 degree of dispersion was prepared.

Then triphenylsulfonium hexafluoroantimonate expressed by the following structural formula

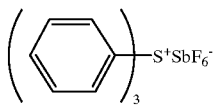

was added as an acid generating substance by 15 wt % to the thus-synthesized copolymer, and a cyclohexanone solution was prepared. This solution was applied, in a 7 μm-thickness by spin coating, to an HMDS treated Si wafer, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds with NMD-3, which is a alkaline aqueous solution, and then rinsed with deionized water for 30 seconds. The threshold energy Eth of the radiation dose for this exposure was 25.1 mJ/cm². A minimum resolution was a 0.5 μm-wide L & S pattern.

EXAMPLE 12

To di-t-butyl itaconate monomer, 20 mol % of MAIB expressed by the following structural formula

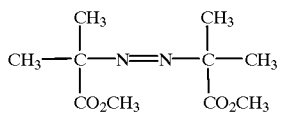

was added. Then bulk polymerization followed at 80° C. for about 9.5 hours. The polymerization was followed by precipitation purification with methanol. Resultantly the copolymer expressed by the following structure formula

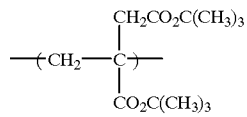

and having a weight-averaged molecular weight of 6061 and a 1.24 degree of dispersion was prepared.

Then triphenylsulfonium hexafluoroantimonate expressed by the following structural formula

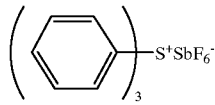

was added as an acid generating substance by 15 wt % to the thus-synthesized copolymer, and a cyclohexanone solution was prepared. This solution was applied, in a 0.7 μm-thickness by spin coating, to an HMDS treated Si wafer, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds with NMD-3, which is a alkaline aqueous solution, and then rinsed with deionized water for 30 seconds. The threshold energy Eth of the radiation dose for this exposure was 7 mJ/cm². A resolution was a 0.5 μm-wide L & S pattern at a 11 mJ/cm₂ radiation dose.

EXAMPLE 13

Adamantyl methacrylate monomer, and di-t-butyl fumarate monomer were loaded by 1:3, and 20 mol % of MAIB expressed by the following structural formula

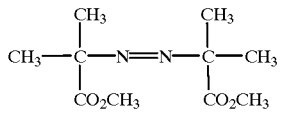

was added. Then bulk polymerization followed at 80° C. for about 25 hours. The polymerization was followed by precipitation purification with methanol. Resultantly the copolymer expressed by the following structure formula

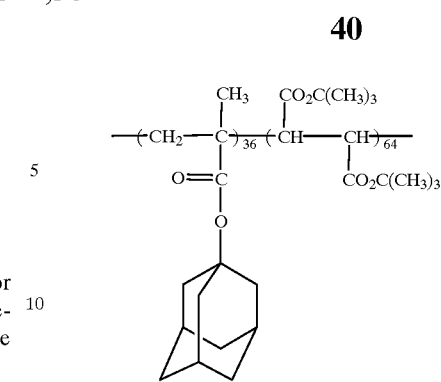

and having a composition ratio of 36:64 and a weight-average of 22645 and a 2.44 degree of dispersion was prepared.

Then triphenylsulfonium hexafluoroantimonate expressed by the following structural formula

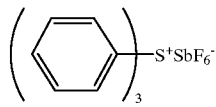

was added as an acid generating substance by 15 wt % to the thus-synthesized copolymer, and a cyclohexanone solution was prepared. This solution was applied, in a 0.7 μm-thickness by spin coating, to an HMDS treated wafer, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds with NMD-3, which is a alkaline aqueous solution, and then rinsed with deionized water for 30 seconds. The threshold energy Eth of the radiation dose for this exposure was 5 mJ/cm². A resolution was a 0.5 μm-wide L & S pattern.

[Control 9]

To the adamnatylacrylate-t-butyl methacrylate copolymer expressed by the following structural formula

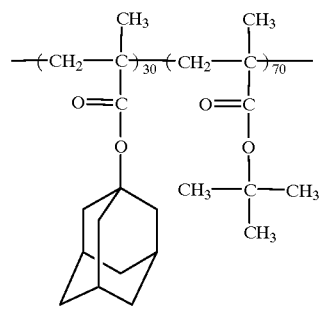

and having a composition ratio of 30:70, a weight-averaged molecular weight of 844 and a 1.61 degree of dispersion, 15 wt % of triphenylsulfonium hexafluoroantimonate expressed by the following structural formula

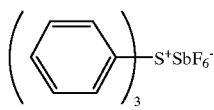

as a polymerization initiator was added, and a cyclohexanone solution was prepared. This solution was applied, by spin coating, to a wafer coated with hard-baked novolak and baked on a hot plate of 60° C. for 100 seconds. And a 0.7 μm-thickness resist film was formed.

The thus-prepared resist film on the wafer was exposed by KrF excimer stepper, then subjected to PEB at 100° C. for 60 seconds, and developed with a 2.38% TMAH aqueous solution, The threshold energy Eth of the radiation dose for this exposure was 15 mJ/cm$^2$. A 0.4 μm-wide L & S pattern was resolved, and the pattern could not be reproduced.

EXAMPLE 14

Methacrylonitrile monomer and t-butyl methacrylate were loaded by 1:1, and 5 mol/l of 1,4-dioxane solvent and 1 mol % of AIBN as a polymerization initiator were added.

Polymerization was reacted at 80° C. for about 8 hours. The polymerization was followed by precipitation purification with an aqueous methanol solution (methanol:water=2:1). Resultantly the polymerization expressed by the following structural formula

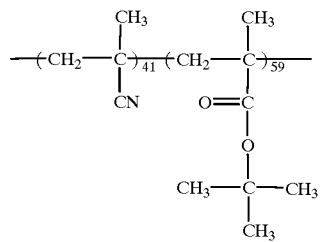

and having a composition ratio of 41:59, a weight-average molecular weight of 16400 and a 1.77 degree of dispersion was prepared. The copolymer had a 98% transmittance for a 1 μm film thickness at the KrF laser wavelength.

Then, 13 wt % cyclohexanone solution of this copolymer was prepared, and to this solution, 15 wt % of triphenylsulfonium hexafluoroantimonate expressed by the following structural formula

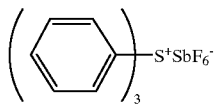

was added as an acid generating substance to prepare a resist solution. This solution was applied, by spin coating, to an HMDS treated Si wafer, and prebaked for 100 seconds on a hot plate of 100° C. And a 0.7 μm-thickness resist film was formed.

The thus-prepared resist film on the wafer was exposed by KrF excimer stepper, and then immersed in 2.38% TMAH aqueous solution for 60 seconds for development. At a 70 mJ/cm$^2$ radiation dose, a 0.3 μm-wide L & S pattern was resolved.

EXAMPLE 15

Acrylonitrile monomer and t-butyl methacrylate were loaded by 3:7, and 5 mol/l of 1,4-dioxane solvent and 1 mol % of AIBN as a polymerization initiator were added. Polymerization was reacted at 80° C. for about 8 hours. The polymerization was followed by precipitation purification with an aqueous methanol solution (methanol:water=2:1). Resultantly the polymerization expressed by the following structural formula

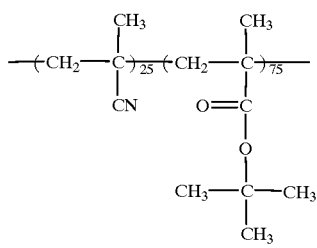

and having a composition ratio of 25:75, a weight-average molecular weight of 18800 and a 1.73 degree of dispersion was prepared. The copolymer had a 98% transmittance for a 1 μm film thickness at the KrF laser wavelength.

Then, using this copolymer, a pattern was formed in the same process as in Example 14. A 0.35 μm-wide L & S pattern was resolved.

EXAMPLE 16

Methacrylonitrile monomer and t-butyl methacrylate were loaded by 1:1, and 5 mol/l of 1,4-dioxane solvent and 1 mol % of AIBN as a polymerization initiator were added.

Polymerization was reacted at 80° C. for about 8 hours. The polymerization was followed by precipitation purification with an aqueous methanol solution (methanol:water=2:1). Resultantly the polymerization expressed by the following structural formula

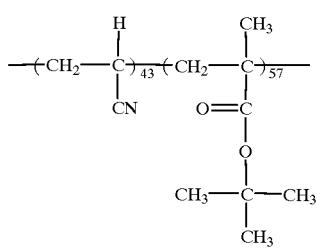

and having a composition ratio of 43:57, a weight-average molecular weight of 31800 and a 1.53 degree of dispersion was prepared.

Then, using this copolymer, a pattern was formed in the same process as in Example 14. A 0.35 μm-wide L & S pattern was resolved.

[Control 10]

5 mol/l of a solvent, 1,4-dioxane, and 1 mol % of AIBN, a polymerization initiator, were added to t-butyl methacrylate monomer, and polymerization was reacted at 80° C. for about 8 hours. The polymerization was followed by precipitation purification with an aqueous solution of methanol (methanol:water=2:1). Resultantly the homopolymer expressed by the following structural formula

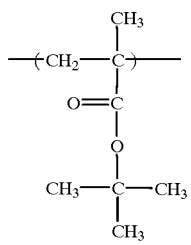

and having a weight-averaged molecular weight of 36000, and a 1.82 degree of dispersion was prepared.

Then, using this copolymer, a pattern was formed in the same process as in Example 14. L & S patterns of below 1 μm-wide peeled off.

EXAMPLE 17

Three kinds of monomers of methacrylonitrile, t-butyl methacrylate, and adamantyl methacrylate were loaded by 1:2:1, and 1 mol/l of a solvent, 1,4-dioxane, and 1 mol % of AIBN, a polymerization initiator were added. Polymerization was reacted at 80° C. for about 8 hours. The polymerization was followed by precipitation purification with an aqueous solution of methanol (methanol:water=2:1). Resultantly the terpolymer expressed by the following structural formula

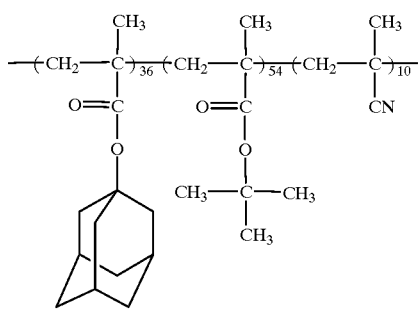

and having a composition ratio of 10:54:36, a weight-averaged molecular weight 5750 and a 1.21 degree of dispersion was prepared.

Then, using this copolymer, a pattern was formed in the same process as in Example 14. A 0.7 μm-wide L & S pattern was resolved at a 250 mJ/cm² radiation dose.

[Control 11]

Using t-butyl methacrylate-adamantyl methacrylate copolymer of a composition ratio of 70:30, patterns were formed in the same process as in Example 14. The patterns were completely peeled off.

EXAMPLE 18

15 wt % cyclohexanone solution of adamantyl methacrylate-3-oxocyclohexyl methacrylate copolymer expressed by the following structural formula

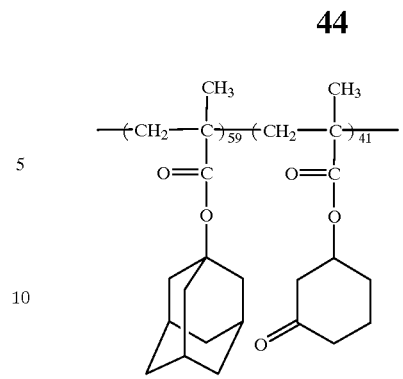

and having a composition ratio of 41:59, a 13900 weight-averaged molecular weight and a 1.51 degree of dispersion was prepared. To this solution, 15 wt % of triphenylsulfonium hexafluoroantimonate expressed by the following structural formula

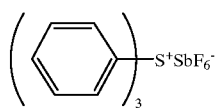

was added as an acid generating substance to prepare a resist solution. This solution was applied by spin coating to a wafer coated with hard-baked novolak resin and baked for 100 seconds on a hot plate of 100° C. A 0.7 μm-thickness resist film was formed.

The thus-prepared resist film on the wafer was exposed by KrF excimer stepper, and then subjected to PEB for 60 seconds. Subsequently the resist film was immersed in mixed liquid of 2.38% TMAH aqueous solution and isopropyl alcohol mixed by a volume ratio of 1:1 for 60 seconds for development. At a 26 mJ/cm² radiation dose, a 0.25 μm-wide L & S pattern was resolved.

[Control 12]

The same process as in Example 18 was conducted, and a PEB treated wafer was immersed in 2.38% TMAH aqueous solution for 60 seconds for development. The minimum resolved pattern was 0.45 μm-wide L & S.

EXAMPLE 19

15 wt % cyclohexanone solution of adamantyl methacrylate-3-oxocyclohexyl methacrylate copolymer expressed by the following structural formula

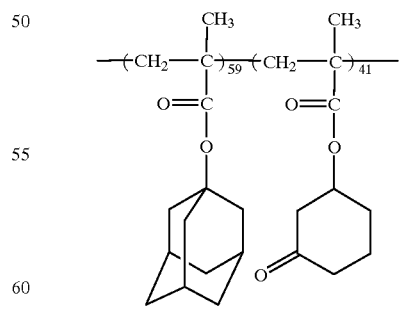

and having a composition ratio of 41:59, a 13900 weight-averaged molecular weight and a 1.51 degree of dispersion was prepared. To this solution, 15 wt % of triphenylsulfonium hexafluoroantimonate expressed by the following structural formula

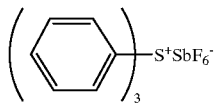

was added as an acid generating substance to prepare a resist solution. This solution was applied by spin coating to a wafer treated with HMDS (hexamethyl disilazane), and baked for 100 seconds on a hot plate of 100° C. A 0.7 μm-thickness resist film was formed.

The thus-prepared resist film on the wafer was exposed by KrF excimer stepper, and then subjected to PEB for 60 seconds. Subsequently the resist film was immersed in mixed liquid of 2.38% TMAH aqueous solution and isopropyl alcohol mixed by a volume ratio of 1:1 for 60 seconds for development. At a 32 mJ/cm$^2$ radiation dose, a 0.30 μm-wide L & S pattern was resolved.

[Control 13]

The same process as in Example 19 was conducted, and a PEB treated wafer was immersed in 2.38% TMAH aqueous solution for 60 seconds for development. Patterns of below 1 μm were completely peeled off.

EXAMPLE 20

Adamantyl methacrylate monomer and t-butyl methacrylate monomer were loaded by 1:1, and 5 mol/l toluene solution was prepared. 20 mol % of AIBN was added as a polymerization initiator. Then polymerization was reacted at 80° C. for about 8 hours, and precipitation purification with methanol followed. And a copolymer expressed by the following structural formula

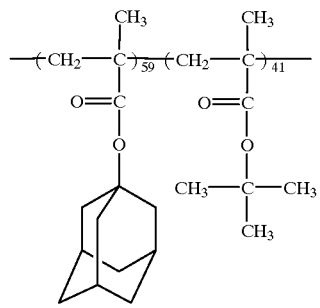

and having a 59:41 composition ratio, a 3351 weight-average molecular weight and a 1.31 degree of dispersion was prepared. No glass transition temperature of this polymer was found by a thermal analysis.

Then triphenylsulfonium hexafluoroantimonate expressed by the following structural formula

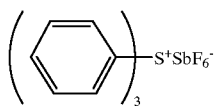

was added as an acid generating substance by 15 wt % to the thus-synthesized copolymer, and a cyclohexanone solution was prepared. This solution was applied by spin coating in a 0.7 μm-thickness onto a wafer coated with hard-baked novolak resin, and prebaked for 100 seconds on a hot plate of 60° C.

The thus-prepared resist film on the wafer was exposed by KrF excimer stepper and then was subjected to PEB at 100° C. for 60 seconds. Subsequently the resist was developed for 60 seconds with mixed liquid of an alkaline aqueous solution, NMD-3 and isopropyl alcohol mixed by a volume ratio of 1:1, and rinsed with deionized water for 30 seconds. The threshold energy Eth of the radiation dose for this exposure was 8 mJ/cm$^2$. The minimum resolved pattern was a 0.30 μm-wide L & S.

EXAMPLE 21

The same process as in Example 20 was conducted. As a development liquid, the mixed liquid in Example 20 was replaced by mixed liquid of NMD-3 and isopropyl alcohol mixed by a volume ratio of 3:3 was used. A 0.40 μm-wide L & S pattern was resolved at a 42 mJ/cm$^2$ radiation dose.

EXAMPLE 22

The same process as in Example 20 was conducted. As a development liquid, the mixed liquid in Example 20 was replaced by mixed liquid of NMD-3 and isopropyl alcohol mixed by a volume ratio of 9:1 was used. A 0.40 μm-wide L & S pattern was resolved at a 98 mJ/cm$^2$ radiation dose.

[Control 14]

The same process as in Example 20 was conducted. As a developer, the mixed liquid in Example 20 was replaced by isopropyl alcohol. A pattern completely peeled off.

EXAMPLE 23

15 wt % cyclohexanone solution of adamantyl methacrylate-3-oxocyclohexyl methacrylate copolymer expressed by the following structural formula

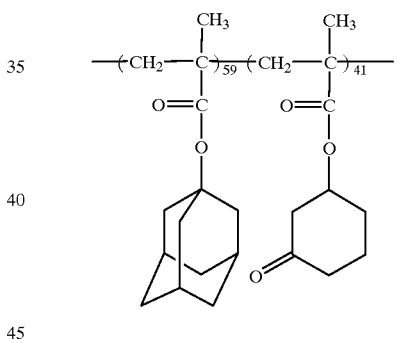

and having a composition ratio of 41:59, a 13900 weight-averaged molecular weight and a 1.51 degree of dispersion was prepared. To this solution, 1 wt % of triphenylsulfonium hexafluoroantimonate expressed by the following structural formula

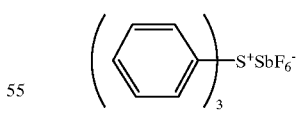

was added to the polymer to prepare a resist solution. This solution was applied by spin coating to a wafer coated with hard-baked novolak resin, and baked for 100 seconds on a hot plate of 100° C. And a 0.7 μm-thickness resist film was formed.

The thus-prepared resist film on the wafer was exposed by an KrF excimer stepper, and then subjected to PEB at 150° C. for 60 seconds. Subsequently the resist film was immersed in mixed liquid of 2.38% of TMAH aqueous solution and isopropyl alcohol by a 1:1 volume ratio for development. A 0.35 μm-wide L & S pattern was resolved at a 88 mJ/cm² radiation dose.

[Control 15]

Using adamantyl methacrylate-t-butyl methacrylate copolymer expressed by the following structural formula

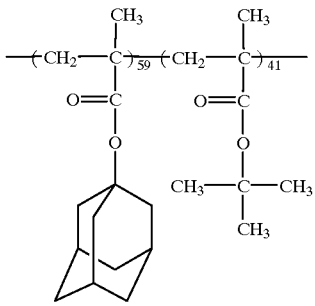

the same process as in Example 23 was conducted to form a pattern. No pattern was formed.

EXAMPLE 24

15 wt % of cyclohexanone solution of adamantyl methacrylate-3-oxocyclohexyl methacrylate copolymer expressed by the following structural formula

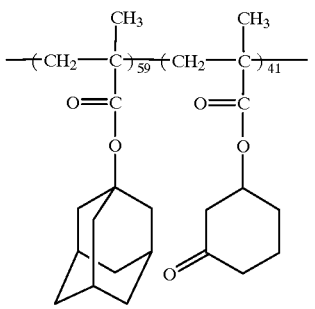

and having a 41:59 composition ratio, a 13900 weight-averaged molecular weight, and a 1.51 degree of dispersion was prepared. To this solution, 1 wt % of triphenylsulfonium hexafluoroantimonate expressed by the following structural formula

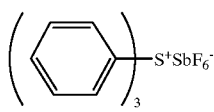

was added to the polymer to prepare a resist solution. This solution was applied by spin coating to a wafer coated with hard-baked novolak resin, and baked for 100 seconds on a hot plate of 100° C. And a 0.7 μm-thickness resist film was formed.

The thus-prepared resist film on the wafer was exposed by an ArF excimer stepper (NA=0.55), and then subjected to PEB at 150° C. for 60 seconds. Subsequently the resist film was immersed in mixed liquid of 2.38% of TMAH aqueous solution and isopropyl alcohol by a 1:1 volume ratio for development. A 0.2 μm-wide L & S pattern was resolved at a 25 mJ/cm² radiation dose.

EXAMPLE 25

15 wt % of cyclohexanone solution of adamantyl methacrylate—3-oxocyclohexyl methacrylate copolymer expressed by the following structural formula

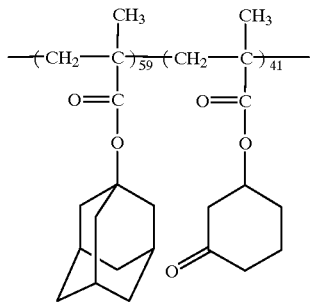

and having a 41:59 composition ratio, a 13900 weight-averaged molecular weight, and a 1.51 degree of dispersion was prepared. To this solution, 2 wt % of triphenylsulfonium hexafluoroantimonate expressed by the following structural formula

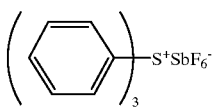

was added as an acid generating substance to the polymer to prepare a resist solution. This solution was applied by spin coating to a wafer coated with hard-baked novolak resin, and baked for 100 seconds on a hot plate of 100° C. And a 0.4 μm-thickness resist film was formed.

The thus-prepared resist film on the wafer was exposed by an ArF excimer stepper (NA=0.55), and then subjected to PEB at 150° C. for 60 seconds. Subsequently the resist film was immersed in mixed liquid of 2.38% of TMAH aqueous solution and isopropyl alcohol by a 1:1 volume ratio for development. A 0.2 μm-wide L & S pattern was resolved at a 12 mJ/cm² radiation dose.

EXAMPLE 26

2-norbornyl methacrylate monomer, t-butyl methacrylate monomer, and methacrylic acid were loaded in a ratio of 2:1:1. 0.5 mol/l of a solvent, 1,4-dioxane and 20 mol % of a polymerization initiator AIBN were added, and polymerization took place for about 9 hours at 80° C. After the polymerization, precipitation purification was conducted with n-hexane. And the terpolymer expressed by the following structural formula

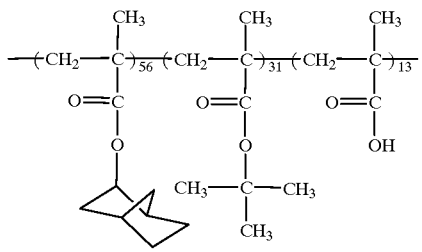

and having a composition ratio of 56:31:13 and a 5833 weight-average molecular weight and 2.34 degree of dispersion was prepared.

Then to the thus-synthesized polymer, 15 wt % of triphenylsulfonium hexafluoroantimonate as an acid generating substance expressed by the following structural formula

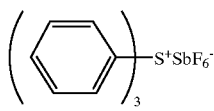

was added, and a cyclohexanone solution was prepared. This solution was applied onto a wafer coated with hard-baked novolak resin, in a 0.7 µm-thickness by spin coating, and the wafer was prebaked on a hot plate at 60° C. for 100 seconds.

The thus-prepared resist film on the wafer was exposed by a KrF excimer stepper and then subjected to PEB at 100° C. for 60 seconds. Subsequently the resist was developed for 60 seconds with NMD-3, an alkali aqueous solution, and then rinsed with deionized water for 30 seconds. The threshold energy Eth of the radiation dose for this exposure was 63 mJ/cm$^2$. A minimum resolution was a 0.35 µm-wide L & S pattern.

EXAMPLE 27

Di-t-butyl itaconate monomer and cyclohexyl methacrylate monomer were loaded in a 3:1 ration, and 20 mol % of MAIB was added. Then bulk polymerization took place at 80° C. for about 10.5 hours. The bulk polymerization was followed by precipitation purification with methanol. And the copolymer expressed by the following structural formula

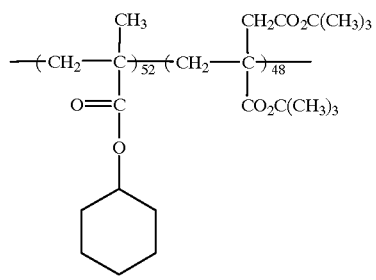

and having a 52:48 composition ratio, a 6923 weight-average molecular weight and a 2.12 degree of dispersion was prepared.

Then to the thus-synthesized polymer, 15 wt % of triphenylsulfonium hexafluoroantimonate as an acid generating substance expressed by the following structural formula

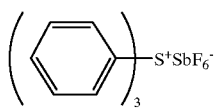

was added, and a cyclohexanone solution was prepared. This solution was applied onto an HMDS treated wafer in a 0.7 µm-thickness by spin coating, and the wafer was prebaked on a hot plate at 60° C. for 100 seconds.

The thus-prepared resist film on the wafer was exposed by a KrF excimer stepper and then subjected to PEB at 100° C. for 60 seconds. Subsequently the resist was developed for 60 seconds with NMD-3, an alkali aqueous solution, and then rinsed with deionized water for 30 seconds. The threshold energy Eth of the radiation dose for this exposure was 9.52 mJ/cm$^2$. A minimum resolution was a 0.5 µm-wide L & S pattern.

EXAMPLE 28

A 15 wt % cyclohexanone solution of tricyclo [5.2.1.026] decanyl methacrylate—3-oxocyclohexyl methacrylate copolymer expressed by the following structural formula

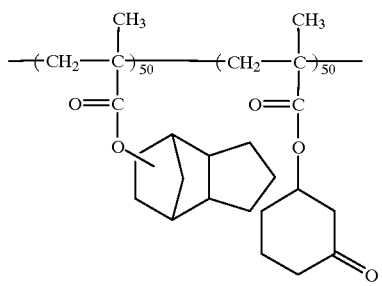

and having a 50:50 composition ratio, a 13900 weight-average molecular weight and a 1.41 dispersion ration was prepared.

Triphenylsulfonium hexafluoroantimonate expressed by the following structural formula

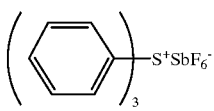

was added to the solution by 10 wt % to the copolymer, and a resist solution was prepared. This resist solution was applied to an HMDS treated Si wafer by spin coating, and the wafer was baked for 100 seconds on a hot plate at 100° C., and a 0.7 µm-thickness resist film was formed.

The thus-coated resist film on the wafer was exposed by a krF excimer stepper and was subjected to PEB at 150° C. for 60 seconds. Then the wafer was immersed into a volume ratio 3:1 mixed liquid of a 2.38% TMAH aqueous solution and isopropyl alcohol for development. At a 23 mJ/cm$^2$ radiation dose, a 0.45 µm-wide L & S pattern was formed.

EXAMPLE 29

5 wt % of triphenylsulfonium triflate expressed by the following structural formula

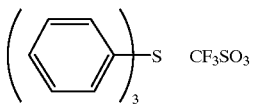

was added as an acid generating substance to vinylphenol-adamantyloxycarbonylmethyl styrene-tert-butyl methacrylate terpolymer expressed by the following structural formula

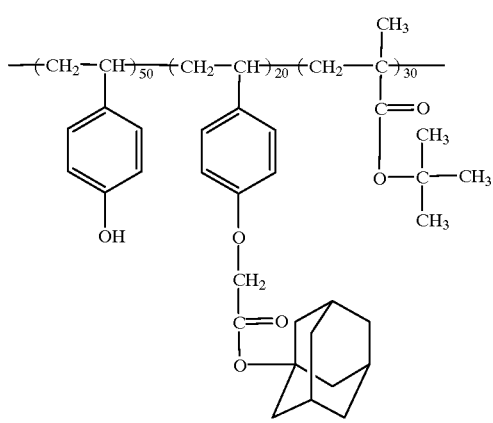

and having a 50:20:30 composition ratio, and an 18 wt % ethyl lactate solution was prepared. This solution was applied onto an Si wafer by spin coating and baked for 90 seconds on a hot plate at 110° C. A 0.7 μm-thickness resist film was formed.

The thus-prepared resist film on the wafer was exposed by a KrF excimer stepper and was subjected to PEB at 90° C. for 60 seconds. Then the resist film was developed with a 2.38% TMAH aqueous solution for 1 minute.

A 0.275 μm-wide L & S pattern was resolved at a 26 mJ/cm² radiation dose. When PEB was conducted after the resist was left for 30 minutes after the exposure, a 0.275 μm-wide L & S pattern was resolved at the same radiation dose.

EXAMPLE 30

5 wt % of triphenylsulfonium triflate expressed by the following structural formula

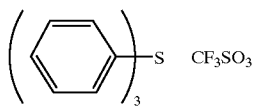

was added as an acid generating substance to vinylphenol-norbornyloxycarbonylmethyl styrene-tert-butyl methacrylate terpolymer expressed by the following structural formula

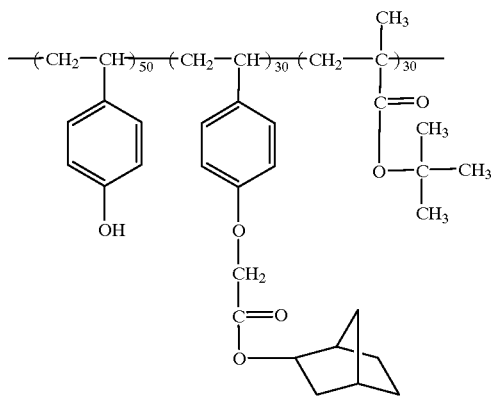

and having a 50:30:30 composition ratio, and an 18 wt % ethyl lactate solution was prepared. This solution was applied onto an Si wafer by spin coating and baked for 90 seconds on a hot plate at 110° C. A 0.7 μm-thickness resist film was formed.

The thus-prepared resist film on the wafer was exposed by a KrF excimer stepper and was subjected to PEB at 90° C. for 60 seconds. Then the resist film was developed with a 2.38% TMAH aqueous solution for 1 minute.

A 0.275 μm-wide L & S pattern was resolved at a 22 mJ/cm² radiation dose. When PEB was conducted after the resist was left for 30 minutes after the exposure, a 0.275 μm-wide L & S pattern was resolved at the same radiation dose.

EXAMPLE 31

5 wt % of triphenylsulfonium triflate expressed by the following structural formula

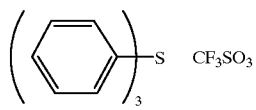

was added as an acid generating substance to vinylphenol-tert-butyl methacrylate copolymer (produced by Maruzen Sekiyu) expressed by the following structural formula

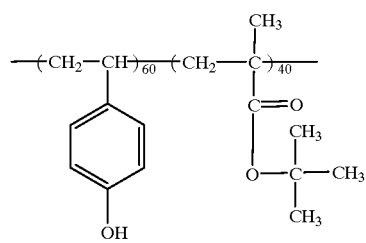

and having a 60:40 composition ratio, and 1-adamantane carboxylate t-butyl expressed by the following formula

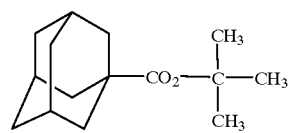

was also added by the same weight % as that of the copolymer, and an 18 wt % ethyl lactate solution was prepared. This solution was applied onto an Si wafer by spin coating and baked for 90 seconds on a hot plate at 110° C. A 0.7 μm-thickness resist film was formed.

The thus-prepared resist film on the wafer was exposed by a KrF excimer stepper and was subjected to PEB at 90° C. for 60 seconds. Then the resist film was developed with a 2.38% TMAH aqueous solution for 1 minute.

A 0.275 μm-wide L & S pattern was resolved at a 8.5 mJ/cm² radiation dose. When PEB was conducted after the resist was left for 30 minutes after the exposure, a 0.275 μm-wide L & S pattern was resolved at the same radiation dose.

The threshold energy Eth of the radiation dose when PEB was conducted immediately after the exposure was 5.5 mJ/cm². The Eth did not substantially change after post exposure 30 minutes delay.

EXAMPLE 32

5 wt % of triphenylsulfonium triflate expressed by the following structural formula

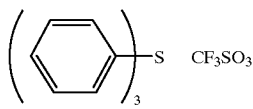

was added as an acid generating substance to vinylphenol-tert-butyl methacrylate copolymer (produced by Maruzen Sekiyu) expressed by the following structural formula

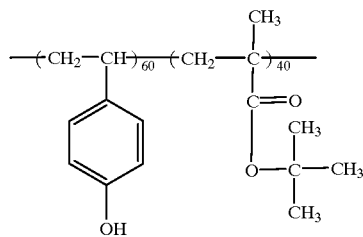

and having a 60:40 composition ratio, and di-t-butyl fumarate expressed by the following formula

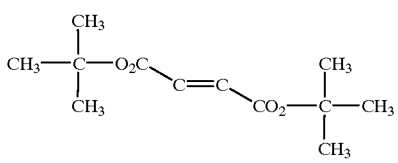

was also added by the same weight % as that of the copolymer, and an 18 wt % ethyl lactate solution was prepared. This solution was applied onto an Si wafer by spin coating and baked for 90 seconds on a hot plate at 110° C. A 0.7 μm-thickness resist film was formed.

The thus-prepared resist film on the wafer was exposed by a KrF excimer stepper and was subjected to PEB at 90° C. for 60 seconds. Then the resist film was developed with a 2.38% TMAH aqueous solution for 1 minute.

A 0.275 μm-wide L & S pattern was resolved at a 12 mJ/cm² radiation dose. When PEB was conducted after the resist was left for 30 minutes after the exposure, a 0.275 μm-wide L & S pattern was resolved at the same radiation dose.

The threshold energy Eth of the radiation dose when PEB was conducted immediately after the exposure was 8 mJ/cm². The Eth did not substantially change after post exposure 30 minutes delay.

EXAMPLE 33

5 wt % of diphenyliodonium triflate expressed by the following structural formula

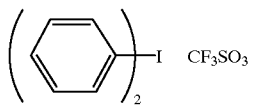

was added as an acid generating substance to vinylphenol-tert-butyl methacrylate copolymer (produced by Maruzen Sekiyu) expressed by the following structural formula

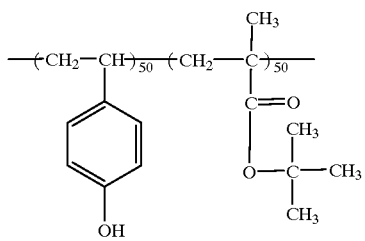

and having a 50:50 composition ratio, and di-t-butyl fumarate expressed by the following formula

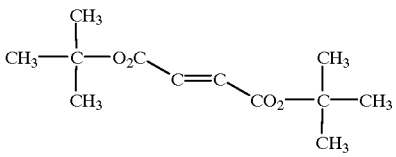

was also added by the same weight % as that of the copolymer, and an 18 wt % ethyl lactate solution was prepared. This solution was applied onto an Si wafer by spin coating and baked for 90 seconds on a hot plate at 110° C. A 0.7 μm-thickness resist film was formed.

The thus-prepared resist film on the wafer was exposed by a KrF excimer stepper and was subjected to PEB at 90° C. for 60 seconds. Then the resist film was developed with a 2.38% TMAH aqueous solution for 1 minute.

A 0.275 μm-wide L & S pattern was resolved at a 18 mJ/cm² radiation dose. When PEB was conducted after the resist was left for 30 minutes after the exposure, a 0.275 μm-wide L & S pattern was resolved with at same radiation dose.

The threshold energy Eth of the radiation dose when PEB was conducted immediately after the exposure was 8 mJ/cm². The Eth did not substantially change after post exposure 30 minutes delay.

EXAMPLE 34

5 wt % of triphenylsulfonium triflate expressed by the following structural formula

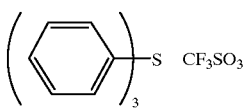

was added as an acid generating substance to vinylphenol-tert-butoxycarbonyloxystyrene copolymer (produced by Maruzen Sekiyu) expressed by the following structural formula

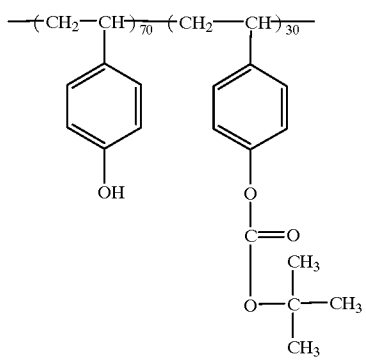

and having a 70:30 composition ratio, and 1-adamantane carboxylate t-butyl expressed by the following formula

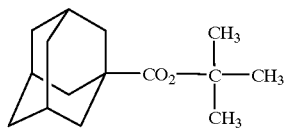

was also added by the same weight % as that of the copolymer, and an 18 wt % ethyl lactate solution was prepared. This solution was applied onto an Si wafer by spin coating and baked for 90 seconds on a hot plate at 110° C. A 0.7 µm-thickness resist film was formed.

The thus-prepared resist film on the wafer was exposed by a KrF excimer stepper and was subjected to PEB at 90° C. for 60 seconds. Then the resist film was developed with a 2.38% TMAH aqueous solution for 1 minute.

A 0.275 µm-wide L & S pattern was resolved at a 35 mJ/cm² radiation dose. When PEB was conducted after the resist was left for 30 minutes after the exposure, a 0.275 µm-wide L & S pattern was resolved with at same radiation dose.

[Control 16]

5 wt % of triphenylsulfonium triflate expressed by the following structural formula

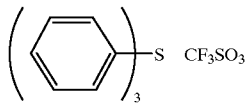

was added as an acid generating substance to vinylphenol-tert-butyl methacrylate copolymer (produced by Maruzen Sekiyu) expressed by the following structural formula

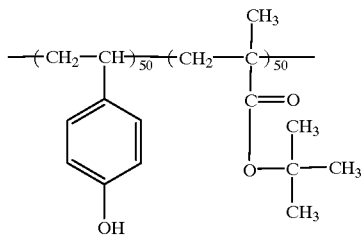

and having a 50:50 composition ratio, and an 18 wt % ethyl lactate solution was prepared. This solution was applied onto an Si wafer by spin coating and baked for 90 seconds on a hot plate at 110° C. A 0.7 µm-thickness resist film was formed.

The thus-prepared resist film on the wafer was exposed by a KrF excimer stepper and was subjected to PEB at 90° C. for 60 seconds. Then the resist film was developed with a 2.38% TMAH aqueous solution for 1 minute.

A 0.275 µm-wide L & S pattern was resolved at a 13 mJ/cm² radiation dose. When PEB was conducted for 60 seconds at 90° C. after the resist was left for 5 minutes after the exposure, the surface became insoluble, and a 0.275 µm-wide L & S pattern could not be resolved at the same radiation dose.

[Control 17]

5 wt % of triphenylsulfonium triflate expressed by the following structural formula

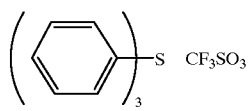

was added as an acid generating substance to vinylphenol-tert-butyl methacrylate copolymer (produced by Maruzen Sekiyu) expressed by the following structural formula

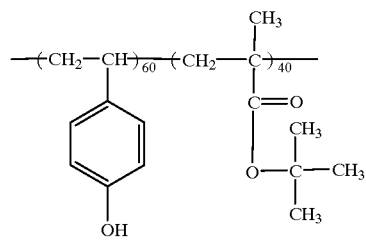

and having a 60:40 composition ratio, and an 18 wt % ethyl lactate solution was prepared. This solution was applied onto an Si wafer by spin coating and baked for 90 seconds on a hot plate at 110° C. A 0.7 µm-thickness resist film was formed.

The thus-prepared resist film on the wafer was exposed by a KrF excimer stepper and was subjected to PEB at 90° C. for 60 seconds. Then the resist film was developed with a 2.38% TMAH aqueous solution for 1 minute.

A 0.3 µm-wide L & S pattern was resolved at an 8 mJ/cm² radiation dose. When PEB was conducted for 60 seconds at 90° C. after the resist was left for 10 minutes after the exposure, the surface became insoluble, and a 0.3 µm-wide L & S pattern could not be resolved at the same radiation dose.

The threshold energy Eth of the radiation dose when PEB was conducted immediately after the exposure was 5.5 mJ/cm², but the Eth in the case of the resist was 10 mJ/cm² after post exposure 30 minutes delay.

[Control 18]

5 wt % of triphenylsulfonium triflate expressed by the following structural formula

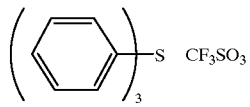

was added as an acid generating substance to vinylphenol-tert-butoxycarbonyloxystyrene copolymer expressed by the following structural formula

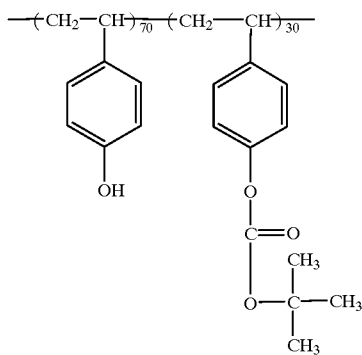

and having a 70:30 composition ratio, and an 18 wt % ethyl lactate solution was prepared. This solution was applied onto an Si wafer by spin coating and baked for 90 seconds on a hot plate at 110° C. A 0.7 μm-thickness resist film was formed.

The thus-prepared resist film on the wafer was exposed by a KrF excimer stepper and was subjected to PEB at 90° C. for 60 seconds. Then the resist film was developed with a 2.38% TMAH aqueous solution for 1 minute.

A 0.275 μm-wide L & S pattern was resolved at a 30 mJ/cm² radiation dose. When PEB was conducted for 60 seconds at 90° C. after the resist was left for 10 minutes after the exposure, the surface became insoluble, and a 0.275 μm-wide L & S pattern could not be resolved at the same radiation dose.

EXAMPLE 35 t-butyl methacrylate monomer and itaconic anhydride monomer were loaded in a ratio of 1:1, and a 2 mol/l solution of 1,4-dioxane solution was prepared. Then 5 mol % of AIBN was added to the solution. Then polymerization took place for about 10 hours at 80° C. After the polymerization precipitation purification was conducted with n-hexane. The copolymer expressed by the following structural formula

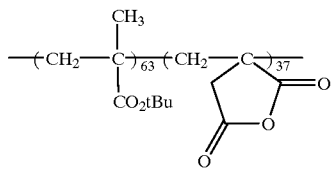

and having a 63:37 composition ratio, a 6500 weigh-average molecular weight and a 2.23 degree of dispersion was prepared.

Then to the thus-synthesized polymer, 15 wt % of triphenylsulfonium hexafluoroantimonate as an acid generating substance expressed by the following structural formula

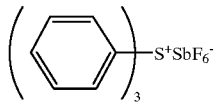

was added, and a cyclohexanone solution was prepared. This solution was applied onto a silicon wafer in a 0.7 μm-thickness by spin coating, and the wafer was prebaked on a hot plate at 100° C. for 100 seconds.

The thus-prepared resist film on the wafer was exposed by a KrF excimer stepper and then subjected to PEB at 100° C. for 60 seconds. Subsequently the resist was developed for 60 seconds with a solution of NMD-3, an alkali aqueous solution and water (volume ratio; NMD-3:water=1:5), and then rinsed with deionized water for 30 seconds. The threshold energy Eth of the radiation dose for this exposure was 17 mJ/cm². A minimum resolution was a 0.275 μm-wide L & S pattern. No pattern peeling or falls were observed.

When, in place of the 1:5 volume ratio solution of NMD-3 and water, a volume ratio 1:10 solution of NMD-3 and water and a 1:20 volume ratio solution of NMD-3 and water were used, the same results were obtained.

[Control 19]

A 2 mol % 1,4-dioxane solution of t-butyl methacrylate monomer was prepared, and 5 mol % of AIBN was added as a polymerization initiator. Polymerization took place for about 10 hours at 80° C. Following the polymerization, precipitation purification was conducted with a solution of methanol and water (methanol:water=3:1). And the polymer expressed by the following structural formula

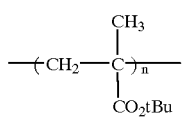

and having a 10097 weight-average molecular weight and a 1.88 degree of dispersion was prepared.

Then 15 wt % of triphenylsulfonium hexafluoroantimonate expressed by the following formula

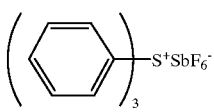

was added to the thus-synthesized polymer as an acid generating substance, and a cyclohexanone solution was prepared. This solution was applied onto a silicon wafer in a 0.7 μm-thickness by spin coating and was prebaked for 100 seconds on a hot plate at 100° C.

The thus-prepared resist film on the wafer was exposed by a KrF excimer stepper and then subjected to PEB at 100° C. for 60 seconds. Subsequently the resist was developed for 60 seconds with a solution of NMD-3, an alkali aqueous solution), and then rinsed with deionized water for 30 seconds. The threshold energy Eth of the radiation dose for this exposure was 17 mJ/cm². A minimum resolution was a 0.35 μm-wide L & S pattern with 56 mJ/cm². L & S patterns below 0.35 μm-wide peeled and vanished.

When a 1:5 volume ratio solution of NMD-3 and water was used as a developer in place of NMD-3, the threshold value energy Eth of the radiation dose was 16.1 mJ/cm². A minimum resolution was a 0.3 μm-wide L & S pattern with 56 mJ/cm². L & S patterns below 0.3 μm-wide peeled and vanished.

EXAMPLE 36

Adamantyl methacrylate monomer, t-butyl acrylate monomer and itaconic anhydride monomer were loaded by 4:2:4, and a 1 mol/l 1,4-dioxane solution was prepared. 10 mol % of AIBN as a polymerization initiator was added to the solution. Then polymerization took place for about 8 hours at 80° C. Following the polymerization, precipitation purification was conducted with methanol. The copolymer expressed by the following structural formula

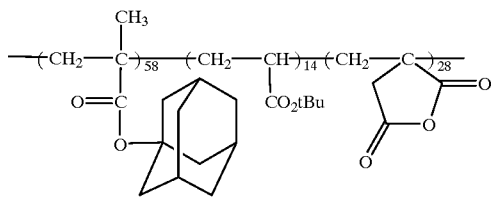

and having a 58:14:28 composition ratio, a 13000 weight-average molecular weight and a 1.81 degree of dispersion was prepared.

15 wt % of triphenylsulfonium hexafluoroantimonate expressed by the following structural formula

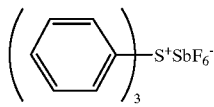

was added, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 130° C. for 60 seconds. Subsequently the resist was developed for 60 seconds with a solution of NMD-3, an alkali aqueous solution, and then rinsed with deionized water for 30 seconds. The threshold energy Eth of the radiation dose for this exposure was 17 mJ/cm$^2$. A minimum resolution was a 0.25 μm-wide L & S pattern with 50 mJ/cm$^2$. No pattern peeling or falls were observed.

When PEB was subjected at 100° C. for 100 seconds, and a 5:1 volume ratio solution of NMD-3 and isopropyl alcohol was used as a developer in place of NMD-3, the threshold value energy Eth of the radiation dose was 25.5 mJ/cm$^2$. A minimum resolution was a 0.275 μm-wide L & S pattern with 44 mJ/cm$^2$. No pattern peeling or falls were observed.

[Control 20]

Adamantyl methacrylate monomer and t-butyl acrylate monomer were loaded by 1:1, and a 5 mol/l toluene solution was prepared. 20 mol % of AIBN as a polymerization initiator was added to the solution. Then polymerization took place for about 8 hours at 80° C. Following the polymerization, precipitation purification was conducted with methanol. The copolymer expressed by the following structural formula

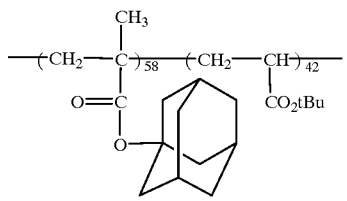

and having a 58:42 composition ratio, a 5100 weight-average molecular weight and a 1.43 degree of dispersion was prepared. The glass transition temperature of this polymer was 126° C. by thermal analysis.

15 wt % of triphenylsulfonium hexafluoroantimonate expressed by the following structural formula

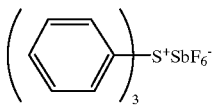

was added, and a cyclohexanone solution was prepared. This solution was applied to a silicon wafer in a 0.7 μm-thickness by spin coating, and then prebaked for 100 seconds on a hot plate at 60° C.

The thus-prepared resist film on the wafer was exposed by a KrF excimer stepper and then subjected to PEB at 100° C. for 60 seconds. Subsequently the resist was developed for 60 seconds with a solution of NMD-3, an alkali aqueous solution, and then rinsed with deionized water for 30 seconds. The threshold energy Eth of the radiation dose for this exposure was 50 mJ/cm$^2$. A minimum resolution was a 0.45 pin-wide L & S pattern with 30 mJ/cm$^2$ Resist residues between patterns were striking, and pattern peeling or falls were observed.

EXAMPLE 37

Dimethyladamantyl methacrylate monomer, t-butyl acrylate monomer and itaconic anhydride monomer were loaded by 4:2:4, and a 1 mol/l 1,4-dioxane solution was prepared. 10 mol % of AIBN as a polymerization initiator was added to the solution. Then polymerization took place for about 8 hours at 80° C. Following the polymerization, precipitation purification was conducted with methanol. The copolymer expressed by the following structural formula

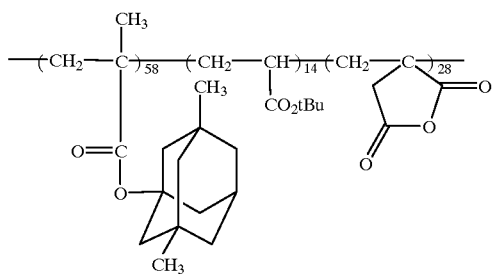

and having a 58:14:28 composition ratio, a 13000 weight-average molecular weight and a 1.81 degree of dispersion was prepared.

15 wt % of triphenylsulfonium hexafluoroantimonate expressed by the following structural formula

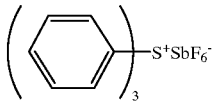

was added, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 130° C. for 60 seconds. Subsequently the resist was developed for 60 seconds with a solution of NMD-3, an alkali aqueous solution, and then rinsed with deionized water for 30 seconds. The threshold energy Eth of the radiation dose for this exposure was 17 mJ/cm$^2$. A minimum resolution was a 0.25 μm-wide L & S pattern with 50 mJ/cm$^2$. No pattern peeling or falls were observed.

EXAMPLE 38

Adamantyl methacrylate monomer, t-butyl α-chloroacrylate monomer and itaconic anhydride monomer were loaded by 4:2:4, and a 1 mol/l 1,4-dioxane solution was prepared. 10 mol % of AIBN as a polymerization initiator was added to the solution. Then polymerization took place for about 8 hours at 80° C. Following the polymerization, precipitation purification was conducted with methanol. The copolymer expressed by the following structural formula

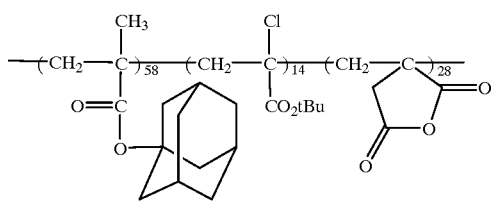

and having a 58:14:28 composition ratio, a 13000 weight-average molecular weight and a 1.81 degree of dispersion was prepared.

15 wt % of triphenylsulfonium hexafluoroantimonate expressed by the following structural formula

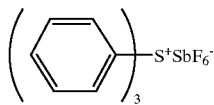

was added, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 130° C. for 60 seconds. Subsequently the resist was developed for 60 seconds with a solution of NMD-3, an alkali aqueous solution, and then rinsed with deionized water for 30 seconds. The threshold energy Eth of the radiation dose for this exposure was 17 mJ/cm². A minimum resolution was a 0.25 μm-wide L & S pattern with 50 mJ/cm². No pattern peeling or falls were observed.

[Control 21]

Adamantyl methacrylate monomer and t-butyl α-chloroacrylate monomer were loaded by 1:1, and a 5 mol/l toluene solution was prepared. 10 mol % of AIBN as a polymerization initiator was added to the solution. Then polymerization took place for about 8 hours at 80° C. Following the polymerization, precipitation purification was conducted with methanol. The copolymer expressed by the following structural formula

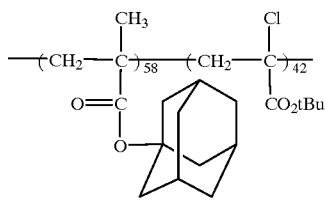

and having a 58:42 composition ratio, a 5100 weight-average molecular weight and a 1.43 degree of dispersion was prepared. The glass transition temperature of this polymer was 126° C.

15 wt % of triphenylsulfonium hexafluoroantimonate expressed by the following structural formula

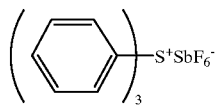

was added, and a cyclohexanone solution was prepared. This solution was applied to a silicon wafer in a 0.7 μm-thickness by spin coating, and then prebaked for 100 seconds on a hot plate at 60° C.

The thus-prepared resist film on the wafer was exposed by a KrF excimer stepper and then subjected to PEB at 100° C. for 60 seconds. Subsequently the resist was developed for 60 seconds with a solution of NMD-3, an alkali aqueous solution, and then rinsed with deionized water for 30 seconds.

Serious pattern peeling took place, and a minimum resolution was a 0.5 μm-wide L & S pattern.

EXAMPLE 39

Adamantyl methacrylate monomer, α,α-dimethylbenzyl methacrylate monomer, and itaconic anhydride monomer were loaded by 4:2:4, and a 1 mol/l 1,4-dioxane solution was prepared. 10 mol % of AIBN as a polymerization initiator was added to the solution. Then polymerization took place for about 8 hours at 80° C. Following the polymerization, precipitation purification was conducted with methanol. The copolymer expressed by the following structural formula

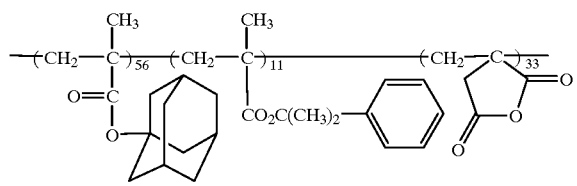

and having a 56:11:33 composition ratio, a 16000 weight-average molecular weight and a 1.91 degree of dispersion was prepared.

15 wt % of triphenylsulfonium hexafluoroantimonate expressed by the following structural formula

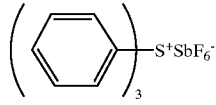

was added, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 100° C. for 60 seconds. Subsequently the resist was developed for 60 seconds with a solution of NMD-3, an alkali aqueous solution, and then rinsed with deionized water for 30 seconds. The threshold energy Eth of the radiation dose for this exposure was 8 mJ/cm². A minimum resolution was a 0.275 μm-wide L & S pattern with 23 mJ/cm². No pattern peeling or falls were observed.

EXAMPLE 40

Adamantyl methacrylate monomer, 3-oxocyclohexyl methacrylate monomer, and itaconic anhydride monomer were loaded by 4:2:4, and a 1 mol/l 1,4-dioxane solution was prepared. 10 mol % of AIBN as a polymerization initiator was added to the solution. Then polymerization took place for about 8 hours at 80° C. Following the polymerization, precipitation purification was conducted with methanol. The copolymer expressed by the following structural formula

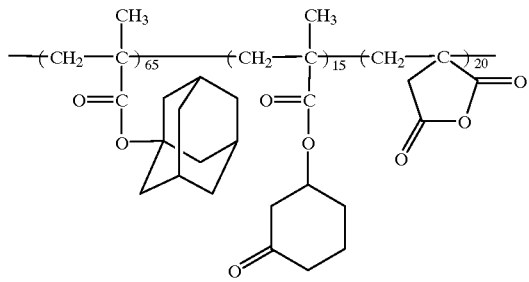

and having a 65:15:20 composition ratio, a 13200 weight-average molecular weight and a 1.92 degree of dispersion was prepared.

15 wt % of triphenylsulfonium hexafluoroantimonate expressed by the following structural formula

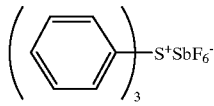

was added, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 130° C. for 60 seconds. Subsequently the resist was developed for 60 seconds with a solution of NMD-3, an alkali aqueous solution, and then rinsed with deionized water for 30 seconds. The threshold energy Eth of the radiation dose for this exposure was 19.2 mJ/cm$^2$. A minimum resolution was a 0.25 μm-wide L & S pattern with 54 mJ/cm$^2$. No pattern peeling or falls were observed.

[Control 22]

Adamantyl methacrylate monomer, 3-oxocyclohexyl methacrylate monomer were loaded by 1:1, and a 5 mol/l toluene solution was prepared. 20 mol % of AIBN as a polymerization initiator was added to the solution. Then polymerization took place for about 8 hours at 80° C. Following the polymerization, precipitation purification was conducted with methanol. The copolymer expressed by the following structural formula

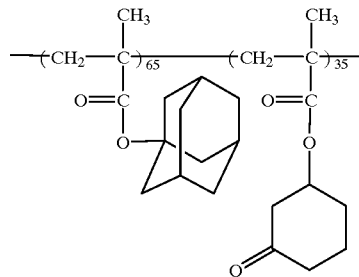

and having a 65:35 composition ratio, a 14400 weight-average molecular weight and a 1.53 degree of dispersion was prepared.

15 wt % of triphenylsulfonium hexafluoroantimonate expressed by the following structural formula

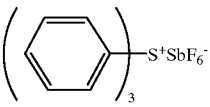

was added, and a cyclohexanone solution was prepared. This solution was applied to a silicon wafer in a 0.7 μm-thickness by spin coating, and then prebaked for 100 seconds on a hot plate at 60° C.

The thus-prepared resist film on the wafer was exposed by a KrF excimer stepper and then subjected to PEB at 100° C. for 60 seconds. Subsequently the resist was developed for 60 seconds with a solution of NMD-3, an alkali aqueous solution, and then rinsed with deionized water for 30 seconds. The threshold energy Eth of the radiation dose for this exposure was 60.2 mJ/cm$^2$. A minimum resolution was a 0.4μm-wide L & S pattern with 208 mJ/cm$^2$. Much pattern peeling took place.

EXAMPLE 41

Adamantyl methacrylate monomer, tetrahydropyranyl methacrylate monomer, and itaconic anhydride monomer were loaded by 4:2:4, and a 1 mol/l 1,4-dioxane solution was prepared. 10 mol % of AIBN as a polymerization initiator was added to the solution. Then polymerization took place for about 8 hours at 80° C. Following the polymerization, precipitation purification was conducted with methanol. The copolymer expressed by the following structural formula

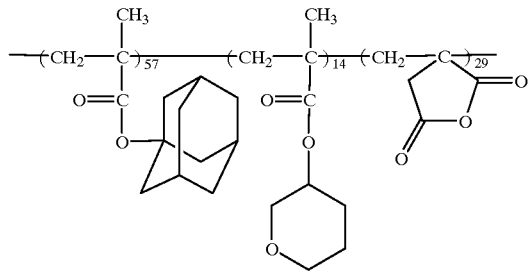

and having a 57:14:29 composition ratio, a 36200 weight-average molecular weight and a 2.14 degree of dispersion was prepared.

15 wt % of triphenylsulfonium hexafluoroantimonate expressed by the following structural formula

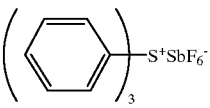

was added, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 130° C. for 60 seconds. Subsequently the resist was developed for 60 seconds with a solution of NMD-3, an alkali aqueous solution, and then rinsed with deionized water for 30 seconds. The threshold energy Eth of the radiation dose for this exposure was 42.2 mJ/cm$^2$. A minimum resolution was a 0.30 μm-wide L & S pattern with 141 mJ/cm². No pattern peeling or falls were observed.

[Control 23]

Adamantyl methacrylate monomer, tetrahydropyranyl methacrylate monomer were loaded by 1:1, and a 5 mol/l toluene solution was prepared. 20 mol % of AIBN as a polymerization initiator was added to the solution. Then polymerization took place for about 8 hours at 80° C. Following the polymerization, precipitation purification was conducted with methanol. The copolymer expressed by the following structural formula

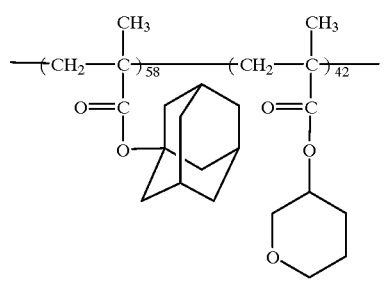

and having a 58:42 composition ratio, a 23000 weight-average molecular weight and a 1.90 degree of dispersion was prepared.

15 wt % of triphenylsulfonium hexafluoroantimonate expressed by the following structural formula

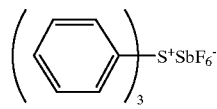

was added, and a cyclohexanone solution was prepared. This solution was applied to a silicon wafer in a 0.7 μm-thickness by spin coating, and then prebaked for 100 seconds on a hot plate at 60° C.

The thus-prepared resist film on the wafer was exposed by a KrF excimer stepper and then subjected to PEB at 100° C. for 60 seconds. Subsequently the resist was developed for 60 seconds with a solution of NMD-3, an alkali aqueous solution, and then rinsed with deionized water for 30 seconds. No pattern could be formed.

EXAMPLE 42

Adamantyl methacrylate monomer, t-butoxystyrene monomer and itaconic anhydride monomer were loaded by 4:2:4, and a 1 mol/l 1,4-dioxane solution was prepared. 10 mol % of AIBN as a polymerization initiator was added to the solution. Then polymerization took place for about 8 hours at 80° C. Following the polymerization, precipitation purification was conducted with methanol. The terpolymer expressed by the following structural formula

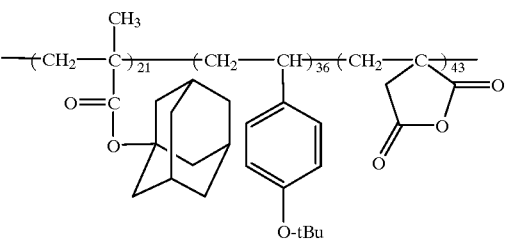

and having a 21:36:43 composition ratio, a 8200 weight-average molecular weight and a 1.95 degree of dispersion was prepared.

15 wt % of triphenylsulfonium hexafluoroantimonate expressed by the following structural formula

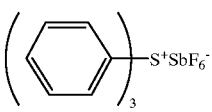

was added, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 130° C. for 60 seconds. Subsequently the resist was developed for 60 seconds with a solution of NMD-3, an alkali aqueous solution, and then rinsed with deionized water for 30 seconds. No pattern peeling or falls were observed.

EXAMPLE 43

Adamantyl methacrylate monomer, t-BOC styrene monomer and itaconic anhydride monomer were loaded by a 4:2:4 ratio, and a 1 mol/l 1,4-dioxane solution was prepared. 10 mol % of AIBN as a polymerization initiator was added to the solution. Then polymerization took place for about 8 hours at 80° C. Following the polymerization, precipitation purification was conducted with methanol. The terpolymer expressed by the following structural formula

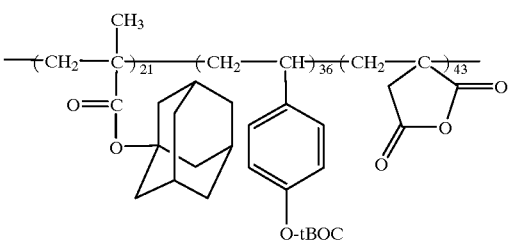

and having a 21:36:43 composition ratio, a 8200 weight-average molecular weight and a 1.95 degree of dispersion was prepared.

15 wt % of triphenylsulfonium hexafluoroantimonate expressed by the following structural formula

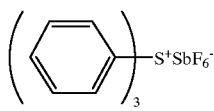

was added, and a cyclohexanone solution was prepared. This solution was applied to a silicon wafer in a 0.7 μm-thickness by spin coating, and then prebaked for 100 seconds on a hot plate at 100° C.

The thus-prepared resist film one the wafer was exposed by a KrF excimer stepper and then subjected to PEB at 130° C. for 60 seconds. Subsequently the resist was developed for 60 seconds with a solution of NMD-3, an alkali aqueous solution, and then rinsed with deionized water for 30 seconds. No pattern peeling or falls were observed.

EXAMPLE 44

Itaconic anhydride monomer and di-t-butyl itaconate monomer were loaded in a 2:3 ratio, and 20 mol % of dimethyl 2,2-azoisobisbutyrate was added as a polymerization initiator. Then, bulk polymerization took place for about 3 hours at 80° C. After e polymerization, precipitation purification was conducted with methanol. The copolymer expressed by the following structural formula

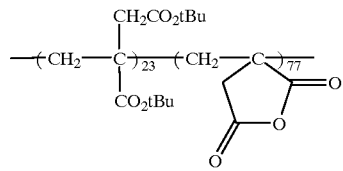

and having a 23:77 composition ratio, a 6357 weight-average molecular weight and 2.34 degree of dispersion was prepared.

15 wt % of triphenylsulfonium hexafluoroantimonate expressed by the following structural formula

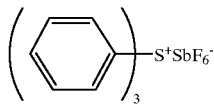

was added, and a cyclohexanone solution was prepared. This solution was applied to a silicon wafer in a 0.7 μm-thickness by spin coating, and then prebaked for 100 seconds on a hot plate at 60° C.

The thus-prepared resist film on the wafer was exposed by a KrF excimer stepper and then subjected to PEB at 100° C. for 60 seconds. Subsequently the resist was developed for 60 seconds with a solution of NMD-3, an alkali aqueous solution, and then rinsed with deionized water for 30 seconds. The threshold energy of the radiation dose was 12.6 mJ/cm$^2$. A minimum resolution was a 0.3 μm-wide L & S pattern with 38 mJ/cm$^2$. No pattern peeling or falls were observed.

EXAMPLE 45

Itaconic anhydride monomer and di-t-butyl fumarate monomer were loaded in a 2:3 ratio, and 20 mol % of dimethyl 2,2-azoisobisbutyrate was added as a polymerization initiator. Then, bulk polymerization took place for about 3 hours at 80° C. After e polymerization, precipitation purification was conducted with methanol. The copolymer expressed by the following structural formula

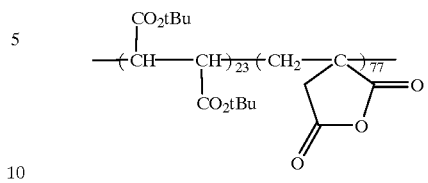

and having a 23:77 composition ration, a 6357 weight-average molecular weight and 2.34 degree of dispersion was prepared.

15 wt % of triphenylsulfonium hexafluoroantimonate expressed by the following structural formula

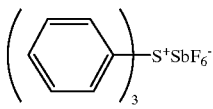

was added, and a cyclohexanone solution was prepared. This solution was applied to a silicon wafer in a 0.7 μm-thickness by spin coating, and then prebaked for 100 seconds on a hot plate at 60° C.

The thus-prepared resist film on the wafer was exposed by a KrF excimer stepper and then subjected to PEB at 100° C. for 60 seconds. Subsequently the resist was developed for 60 seconds with a solution of NMD-3, an alkali aqueous solution, and then rinsed with deionized water for 30 seconds. The threshold energy of the radiation dose was 12.6 mJ/cm$^2$. A minimum resolution was a 0.3 μm-wide L & S pattern with 38 mJ/cm$^2$. No pattern peeling or falls were observed.

EXAMPLE 46

Methacrylonitrile monomer, t-butyl methacrylate monomer and itaconic anhydride monomer were loaded by 4:2:4, and a 5 mol/l 1,4-dioxane solution was prepared. 1 mol % of AIBN as a polymerization initiator was added to the solution. Then polymerization took place for about 8 hours at 80° C. Following the polymerization, precipitation purification was conducted with n-hexane. The terpolymer expressed by the following structural formula

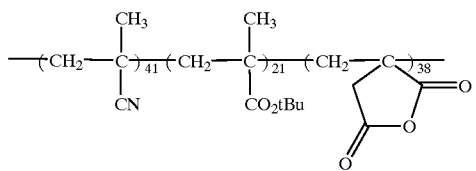

and having a 41:21:38 composition ratio, a 26400 weight-average molecular weight and a 1.87 degree of dispersion was prepared.

15 wt % of triphenylsulfonium hexafluoroantimonate expressed by the following structural formula

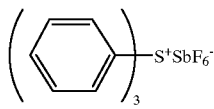

was added, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 100° C. for 60 seconds. Subsequently the resist was developed for 60 seconds with a 2.3% TMAH aqueous solution. A 0.3 μm-wide L & S pattern was resolved at a 41 mJ/cm² radiation dose.

[Control 24]

Methacrylonitrile monomer and t-butyl methacrylate monomer were loaded by 1:1, and a 5 mol/l 1,4-dioxane solution and 1 mol % of AIBN, a polymerization initiator were added. Then polymerization took place for about 8 hours at 80° C. Following the polymerization, precipitation purification was conducted with a mixed solution of methanol and water (methanol:water =2:1). The copolymer expressed by the following structural formula

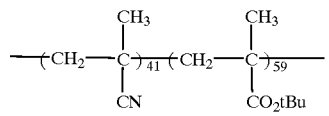

and having a 41:59 composition ratio, a 16400 weight-average molecular weight and a 1.77 degree of dispersion was prepared.

13 wt % of cyclohexanone solution of this copolymer was prepared, and triphenylsulfonium hexafluoroantimonate expressed by the following structural formula

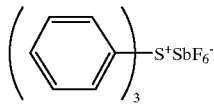

was added to this solution as a substance generating substance by 15 wt % to the polymer, and a resist solution was prepared. This solution was applied onto a silicon wafer by spin coating and prebaked for 100 seconds on a hot plate at 100° C. And a 0.7 μm-thickness thin film was formed.

The thus-prepared resist film on the wafer was exposed by a KrF excimer stepper and then subjected to PEB at 100° C. for 60 seconds. Subsequently the resist was developed for 60 seconds with a 2.38% TMAH aqueous solution. A 0.3 μm-wide L & S pattern was resolved at a 70 mJ/cm² radiation dose, but in comparison with that of the case without methacrylonitrile (Control 19), the sensitivity was lower.

EXAMPLE 47

Methyl α-cyanoacrylate monomer, t-butyl methacrylate monomer and itaconic anhydride were loaded by 4:2:4, and a 1 mol/l 1,4-dioxane solution was prepared. 10 mol % of AIBN as a polymerization initiator was added to the solution. Then polymerization took place for about 8 hours at 80° C. Following the polymerization, precipitation purification was conducted with methanol. The terpolymer expressed by the following structural formula

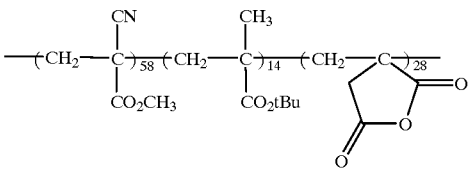

and having a 58:14:28 composition ratio, a 13000 weight-average molecular weight and a 1.81 degree of dispersion was prepared.

15 wt % of triphenylsulfonium hexafluoroantimonate expressed by the following structural formula

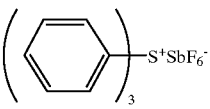

was added, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 130° C. for 60 seconds. Subsequently the resist was developed for 60 seconds with NMD-3, an alkali aqueous solution and rinsed for 30 seconds with deionized water. The threshold energy of the radiation dose was 17 mJ/cm². A minimum resolution was a 0.25 μm-wide L & S pattern with 50 mJ/cm². No pattern peeling or falls were observed.

EXAMPLE 48

Adamantyl methacrylate monomer, t-amyl methacrylate monomer and itaconic anhydride were loaded by 4:2:4, and a 1 mol/l 1,4-dioxane solution was prepared. 10 mol % of AIBN as a polymerization initiator was added to the solution. Then polymerization took place for about 8 hours at 80C. Following the polymerization, precipitation purification was conducted with methanol. The copolymer expressed by the following structural formula

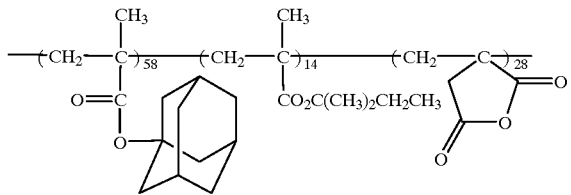

and having a 58:14:28 composition ratio, a 13000 weight-average molecular weight and a 1.81 degree of dispersion was prepared.

15 wt % of triphenylsulfonium hexafluoroantimonate expressed by the following structural formula

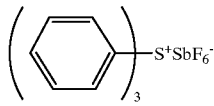

was added to the thus-synthesized polymer, and a cyclohexanone solution was prepared. This solution was applied to a silicon wafer in a 0.7 μm-thickness by spin coating, and then prebaked for 100 seconds on a hot plate at 100° C.

The thus-prepared resist film on the wafer was exposed by a KrF excimer stepper and then subjected to PEB at 130° C. for 60 seconds. Subsequently the resist was developed for 60 seconds with NMD-3, an alkali aqueous solution and rinsed for 30 seconds with deionized water. The threshold energy of the radiation dose was 17 mJ/cm². A minimum resolution was a 0.25 μm-wide L & S pattern with 50 mJ/cm². No pattern peeling or falls were observed.

EXAMPLE 49

A 15 wt % cyclohexanone solution of 3-oxocyclohexyl methacrylate-adamantyl methacrylate copolymer expressed by the following structural formula

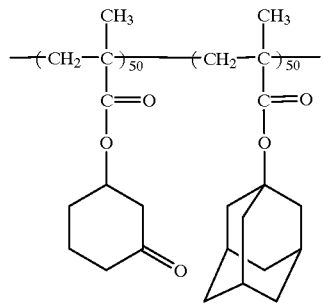

and having a 50:50 composition ratio was prepared.

Triphenylsulfonium hexafluoroantimonate was added to the solution by 2 wt % to the copolymer, and a resist solution was prepared.

This resist solution was applied to a Si wafer by spin coating, and the wafer was baked for 100 seconds on a hot plate at 100° C., and a 0.7 μm-thickness resist film was formed. A solution of 5 wt % of polyolefine resin in t-butylcyclohexane was applied onto the wafer by spin coating and baked for 100 seconds on a hot plate at 100° C., and a 0.2 μm-thickness protecting film was formed.

The thus-coated resist film on the wafer was exposed by a KrF excimer stepper and was subjected to PEB at 100° C. for 60 seconds. Then cyclohexane was applied onto the wafer by spin coating, and the protecting film was removed.

Then the wafer was immersed into a 2.38% TMAH solution for development.

A 0.45 μm-wide L & S pattern was resolved at a 210 mJ/cm² radiation dose.

[Control 25]

A 15 wt % cyclohexanone solution of 3-oxocyclohexyl methacrylate-adamantyl methacrylate copolymer expressed by the following structural formula

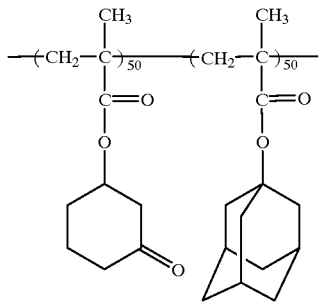

and having a 50:50 composition ratio was prepared.

Triphenylsulfonium hexafluoroantimonate was added to the solution by 2 wt % to the copolymer, and a resist solution was prepared.

This resist solution was applied to an HMDS treated Si wafer by spin coating, and the wafer was baked for 100 seconds on a hot plate at 100° C., and a 0.7 μm-thickness resist film was formed. A solution of 5 wt % of polyolefine resin in heptane was applied onto the wafer by spin coating. The solution did not homogeneously spread over the wafer, and a protecting film could not be applied.

[Control 26]

A 15 wt % cyclohexanone solution of poly adamantylmethacrylate expressed by the following structural formula

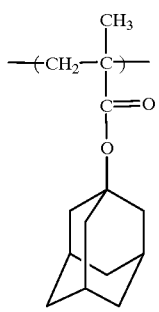

was prepared.

This solution was applied to an HMDS treated Si wafer by spin coating, and the wafer was baked for 100 seconds on a hot plate at 100° C., and a 0.7 μm-thickness resist film was formed.

A solution of 5 wt % of polyolefine resin in t-butylcyclohexane was applied onto the wafer by spin coating, then the thin film of poly adamantylmethacrylate was resolved.

[Control 27]

A 15 wt % cyclohexanone solution of 3-oxocyclohexyl methacrylate-adamantyl methacrylate expressed by the following structural formula

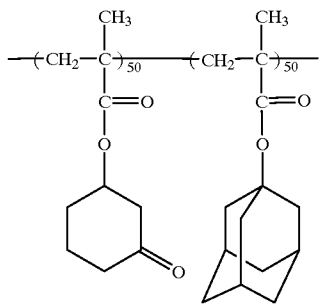

and having a 50:50 composition ratio was prepared. 2 wt % of triphenylsulfonium hexafluoroantimonate as an acid generating substance was added to this solution, and a resist solution was prepared.

This solution was applied to an HMDS treated Si wafer by spin coating, and the wafer was baked for 100 seconds on a hot plate at 100° C., and a 0.7 μm-thickness resist film was formed.

The resist thin film was exposed by a KrF stepper without applying a protecting film on the wafer, and then subjected to PEB for 60 seconds at 150° C.

Then the resist film was developed with a 2.38 TMAH aqueous solution.

An unresolved layer was generated on the surface of the resist thin film, and no pattern could be resolved at a 300 mJ/cm² radiation dose.

EXAMPLE 50

A 15 wt % cyclohexanone solution of 3-oxocyclohexyl methacrylate-adamantyl methacrylate copolymer expressed by the following structural formula

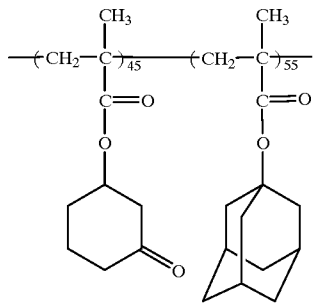

and having a 45:55 composition ratio was prepared.

Triphenylsulfonium hexafluoroantimonate as an acid generating substance was added to the solution by 2 wt % to the copolymer, and a resist solution was prepared.

This resist solution was applied to an HMDS treated Si wafer by spin coating, and the wafer was baked for 100 seconds on a hot plate at 100° C., and a 0.7 μm-thickness resist film was formed.

A solution of 5 wt % of polyolefine resin in 1,5-cyclooctadiene expressed by the following structural formula

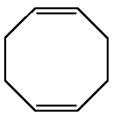

was applied onto the wafer by spin coating and baked for 100 seconds on a hot plate at 100° C., and a 0.2 μm-thickness protecting film was formed.

The thus-coated resist film on the wafer was exposed by a KrF excimer stepper and was subjected to PEB at 150° C. for 60 seconds. Then cyclohexane was applied onto the wafer by spin coating, and the protecting film was removed.

Then the wafer was immersed for 60 seconds in a 8:1 volume ratio-mixed solution of 2.38% TMAH aqueous solution and isopropyl alcohol for development.

A 0.275 μm-wide L & S pattern was resolved at a 70 mJ/cm² radiation dose.

[Control 28]

A 15 wt % cyclohexanone solution of 3-oxocyclohexyl methacrylate-adamantyl methacrylate copolymer expressed by the following structural formula

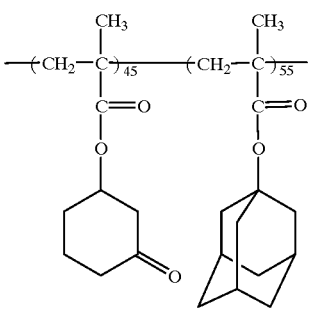

and having a 45:55 composition ratio was prepared.

Triphenylsulfonium hexafluoroantimonate as an acid generating substance was added to the solution by 2 wt % to the copolymer, and a resist solution was prepared.

This resist solution was applied to an HMDS treated Si wafer by spin coating, and the wafer was baked for 100 seconds on a hot plate at 100° C., and a 0.7 μm-thickness resist film was formed.

The resist film was exposed by a KrF stepper without application of a protecting film, and then subjected to PEB for 60 seconds at 150° C.

Then, the wafer was immersed in a 8:1 volume ratio mixed solution of a TMAH aqueous solution and isopropyl alcohol for 60 seconds for development.

Even with the radiation dose increased up to 100 mJ/cm², only a 0.35 μm-wide L & S pattern was resolved.

EXAMPLE 51

A 15 wt % cyclohexanone solution of 3-oxocyclohexyl methacrylate-dimethyladamantyl methacrylate copolymer expressed by the following structural formula

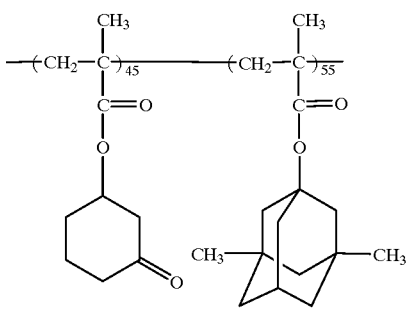

and having a 45:55 composition ratio was prepared.

Triphenylsulfonium hexafluoroantimonate as an acid generating substance was added to the solution by 5 wt % to the copolymer, and a resist solution was prepared.

This resist solution was applied to an HMDS treated Si wafer by spin coating, and the wafer was prebaked for 100 seconds on a hot plate at 100° C., and a 0.7 μm-thickness resist film was formed.

A solution of 5 wt % of polydiene resin in limonene expressed by the following structural formula

was applied onto the wafer by spin coating and baked for 100 seconds on a hot plate at 100° C., and a 0.2 μm-thickness protecting film was formed.

The thus-coated resist film on the wafer was exposed by a KrF excimer stepper and was subjected to PEB at 150° C. for 60 seconds. Then cyclohexane was applied onto the wafer by spin coating, and the protecting film was removed.

Then the wafer was immersed for 60 seconds in a 3:1 volume ratio-mixed solution of 2.38% TMAH aqueous solution and isopropyl alcohol for development.

A 0.25 μm-wide L & S pattern was resolved at an 18 mJ/cm² radiation dose.

[Control 29]

A 15 wt % cyclohexanone solution of 3-oxocyclohexyl methacrylate-dimethyladamantyl methacrylate copolymer expressed by the following structural formula

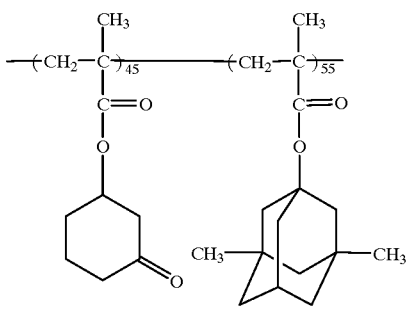

and having a 45:55 composition ratio was prepared.

Triphenylsulfonium hexafluoroantimonate as an acid generating substance was added to the solution by 5 wt % to the copolymer, and a resist solution was prepared.

This resist solution was applied to an HMDS treated Si wafer by spin coating, and the wafer was prebaked for 100 seconds on a hot plate at 100° C., and a 0.7 μm-thickness resist film was formed.

The thus-coated resist film on the wafer was exposed by a KrF excimer stepper without application of a protecting film and was subjected to PEB at 150° C. for 60 seconds.

Then the wafer was immersed for 60 seconds in a 3:1 volume ratio-mixed solution of 2.38% TMAH aqueous solution and isopropyl alcohol for development.

A 0.25 μm-wide L & S pattern was resolved at an 18 mJ/cm² radiation dose, but the pattern was a much thinner line pattern than desired.

EXAMPLE 52

A 15 wt % cyclohexanone solution of t-butyl methacrylate-adamantyl acrylate-methacrylic acid terpolymer expressed by the following structural formula

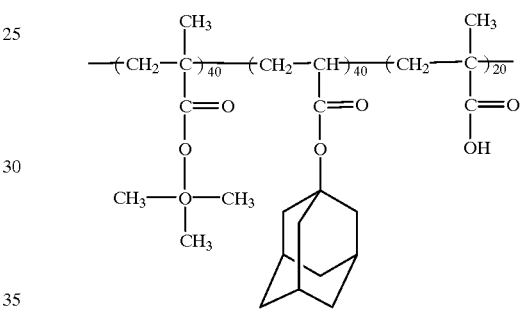

and having a 40:40:20 composition ratio was prepared. Triphenylsulfonium hexafluoroantimonate as an acid generating substance was added to the solution by 2 wt % to the copolymer, and a resist solution was prepared.

This resist solution was applied to an HMDS treated Si wafer by spin coating, and the wafer was prebaked for 100 seconds on a hot plate at 100° C., and a 0.7 μm-thickness resist film was formed.

A solution of 5 wt % of polyolefine resin in p-cymene was applied onto the wafer by spin coating and baked for 100 seconds on a hot plate at 100° C., and a 0.2 μm-thickness protecting film was formed.

The thus-coated resist film on the wafer was exposed by a KrF excimer stepper and was subjected to PEB at 150° C. for 60 seconds. Then cyclohexane was applied onto the wafer by spin coating, and the protecting film was removed.

Then the wafer was immersed for 60 seconds in a 2.38% TMAH aqueous solution for development.

A 0.3 μm-wide L & S pattern was resolved at a 35 mJ/cm² radiation dose.

[Control 30]

A 15 wt % cyclohexanone solution of t-butyl methacrylate-adamantyl acrylate copolymer expressed by the following structural formula

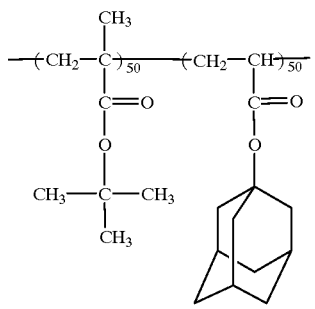

and having a 50:50 composition ratio was prepared. Triphenylsulfonium hexafluoroantimonate as an acid generating substance was added to the solution by 2 wt % to the copolymer, and a resist solution was prepared.

This resist solution was applied to an HMDS treated Si wafer by spin coating, and the wafer was prebaked for 100 seconds on a hot plate at 100° C., and a 0.7 μm-thickness resist film was formed.

A solution of 5 wt % of polyolefine resin in p-cymene was applied onto the wafer by spin coating, then the resist thin film was resolved.

[Control 31]

A 15 wt % cyclohexanone solution of t-butyl methacrylate-adamantyl acrylate-methacrylic acid terpolymer expressed by the following structural formula

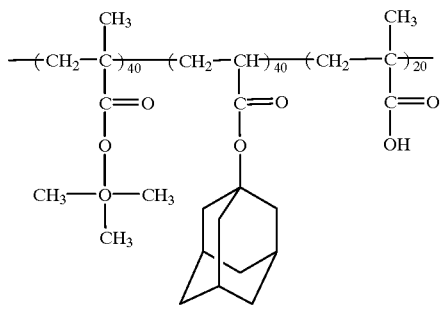

and having a 40:40:20 composition ratio was prepared. Triphenylsulfonium hexafluoroantimonate as an acid generating substance was added to the solution by 2 wt % to the copolymer, and a resist solution was prepared.

This resist solution was applied to an HMDS treated Si wafer by spin coating, and the wafer was prebaked for 100 seconds on a hot plate at 100° C., and a 0.7 μm-thickness resist film was formed.

A solution of 5 wt % of polyolefine resin in xylene was applied onto the wafer by spin coating, then the resist film was resolved.

EXAMPLE 53

A 15 wt % cyclohexanone solution of t-butyl methacrylate-norbornyl methacrylate-hydroxyethyl methacrylate terpolymer expressed by the following structural formula

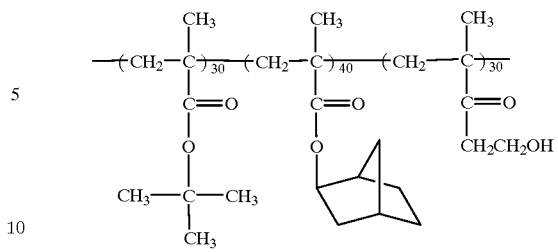

and having a 30:40:30 composition ratio was prepared. Triphenylsulfonium hexafluoroantimonate as an acid generating substance was added to the solution by 5 wt % to the copolymer, and a resist solution was prepared.

This resist solution was applied to an HMDS treated Si wafer by spin coating, and the wafer was prebaked for 100 seconds on a hot plate at 100° C., and a 0.7 μm-thickness resist film was formed.

A solution of 5 wt % of polydiene resin in 1-decene expressed by the following structural formula

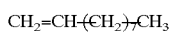

was applied onto the wafer by spin coating and baked for 100 seconds on a hot plate at 100° C., and a 0.2 μm-thickness protecting film was formed.

The thus-coated resist film on the wafer was exposed by a KrF excimer stepper and was subjected to PEB at 150° C. for 60 seconds. Then cyclohexane was applied onto the wafer by spin coating, and the protecting film was stripped.

Then the wafer was immersed for 60 seconds in a 2.38% TMAH aqueous solution for development.

A 0.3 μm-wide L & S pattern was resolved at a 40 mJ/cm² radiation dose.

[Control 32]

A 15 wt % cyclohexanone solution of t-butyl methacrylate-norbornyl methacrylate copolymer expressed by the following structural formula

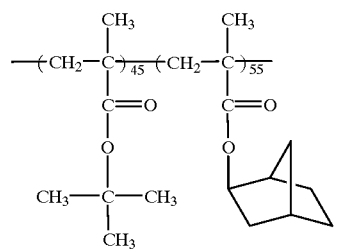

and having a 45:55 composition ratio was prepared. Triphenylsulfonium hexafluoroantimonate as an acid generating substance was added to the solution by 2 wt % to the copolymer, and a resist solution was prepared.

This resist solution was applied to an HMDS treated Si wafer by spin coating, and the wafer was prebaked for 100 seconds on a hot plate at 100° C., and a 0.7 μm-thickness resist film was formed.

A solution of 5 wt % of polydiene resin in 1-decene expressed by the following structural formula

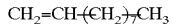

was applied onto the wafer by spin coating, and the resist film was resolved.

[Control 33]

A 15 wt % cyclohexanone solution of t-butyl methacrylate-norbornyl methacrylate-hydroxyethyl methacrylate terpolymer expressed by the following structural formula

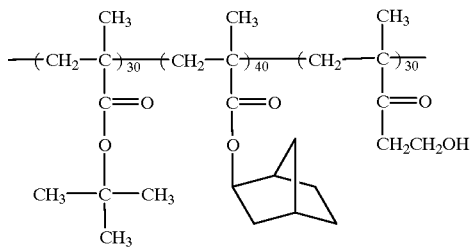

and having a 30:40:30 composition ratio was prepared. Triphenylsulfonium hexafluoroantimonate as an acid generating substance was added to the solution by 5 wt % to the copolymer, and a resist solution was prepared.

This resist solution was applied to an HMDS treated Si wafer by spin coating, and the wafer was prebaked for 100 seconds on a hot plate at 100° C., and a 0.7 µm-thickness resist film was formed.

The thus-coated resist film on the wafer was exposed by a KrF excimer stepper without application of a protecting film and was subjected to PEB at 150° C. for 60 seconds.

Then the wafer was immersed for 60 seconds in a 2.38% TMAH aqueous solution for development.

An unsolved layer was generated on the surface of the resist, and no pattern could be resolved.

EXAMPLE 54

15 wt % of triphenylsulfonium hexafluoroantimonate as an acid generating substance was added to adamantyl methacrylate-t-butyl acrylate-itaconic anhydride terpolymer expressed by the following structural formula

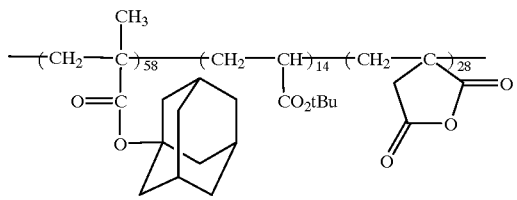

and having a 58:14:28 composition ratio, and a cyclohexanone solution was prepared. This resist solution was applied to a Si wafer by spin coating, and the wafer was prebaked for 100 seconds on a hot plate at 100° C., and a 0.7 µm-thickness resist film was formed.

A solution of 5 wt % of polyolefine resin in t-butylcyclohexane expressed by the following structural formula

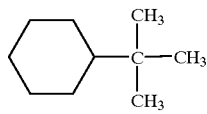

was applied onto the wafer by spin coating and baked for 100 seconds on a hot plate at 100° C., and a 0.2 µm-thickness protecting film was formed.

The thus-coated resist film on the wafer was exposed by a KrF excimer stepper and was subjected to PEB at 100° C. for 60 seconds. Then cyclohexane was applied onto the wafer by spin coating, and the protecting film was removed.

Then the resist film was developed for 60 seconds with NMD-3, an alkali aqueous solution and rinsed for 30 seconds with deionized water. The threshold energy of the radiation dose was 13 mJ/cm². A 0.25 µm-wide L & S pattern was resolved at 41 mJ/cm².

[Control 34]

15 wt % of triphenylsulfonium hexafluoroantimonate as an acid generating substance was added to adamantyl methacrylate-t-butyl acrylate copolymer expressed by the following structural formula

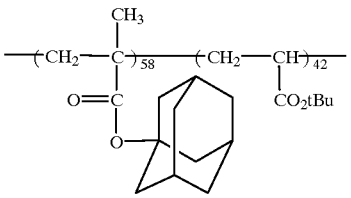

and having a 58:42 composition ratio, and a cyclohexanone solution was prepared. This resist solution was applied to a Si wafer by spin coating, and the wafer was prebaked for 100 seconds on a hot plate at 100° C., and a 0.7 µm-thickness resist film was formed.

A solution of 5 wt % of polyolefine resin in t-butylcyclohexane expressed by the following structural formula

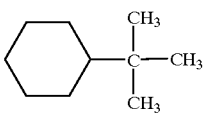

was applied onto the wafer by spin coating, and the resist thin film became opaque.

[Control 35]

A 15 wt % of triphenylsulfonium hexafluoroantimonate as an acid generating substance was added to adamantyl methacrylate-t-butyl methacrylate-itaconic anhydride terpolymer expressed by the following structural formula

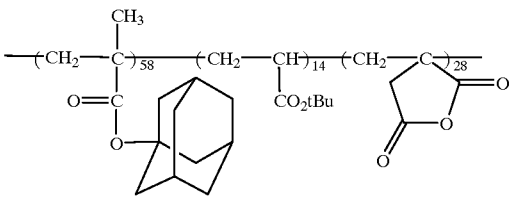

and having a 58:14:28 composition ratio and a cyclohexanone solution was prepared. This resist solution was applied to a Si wafer in a 7 µm-thickness by spin coating and prebaked for 100 seconds on a hot plate at 100° C.

A solution of 5 wt % of polyolefine resin in xylene was applied onto the wafer by spin coating, and the resist thin film was resolved.

Toluene and ethylene benzene were used as coating solvents in place of xylene, and similarly the resist thin films were resolved.

EXAMPLE 55

15 wt % of triphenylsulfonium hexafluoroantimonate as an acid generating substance was added to adamantyl methacrylate-t-butyl acrylate-itaconic anhydride terpolymer expressed by the following structural formula

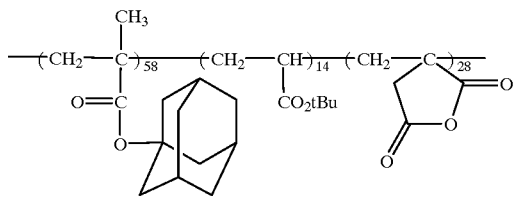

and having a 58:14:28 composition ratio, and a cyclohexanone solution was prepared. This resist solution was applied to a Si wafer in a 0.7 μm-thickness by spin coating, and prebaked for 100 seconds on a hot plate at 100° C.

A solution of 5 wt % of polyolefine resin in limonene expressed by the following structural formula

was applied onto the wafer by spin coating and baked for 100 seconds on a hot plate at 100° C., and a 0.2 μm-thickness protecting film was formed.

The thus-coated resist film on the wafer was exposed by a KrF excimer stepper and was subjected to PEB at 100° C. for 60 seconds. Then cyclohexane was applied onto the wafer by spin coating, and the protecting film was removed.

Then the resist film was developed for 60 seconds with NMD-3, an alkali aqueous solution and rinsed for 30 seconds with deionized water. The threshold energy of the radiation dose was 13 mJ/cm². A 0.25 μm-wide L & S pattern was resolved at 41 mJ/cm².

The same resolving power was obtained by using as a coating solvent, in place of limonene, 1,5-cyclooctadiene expressed by the following structural formula

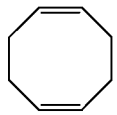

or using, 1-decene expressed by the following structural formula

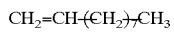

[Control 36]

15 wt % of triphenylsulfonium hexafluoroantimonate as an acid generating substance was added to adamantyl methacrylate-t-butyl acrylate-itaconic anhydride terpolymer expressed by the following structural formula

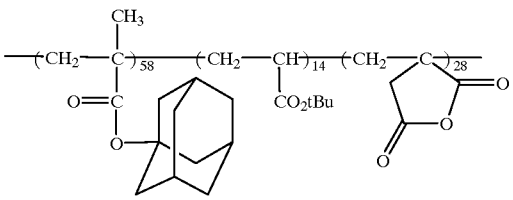

and having a 58:14:28 composition ratio, and a cyclohexanone solution was prepared. This resist solution was applied to a Si wafer in a 0.7 μm-thickness by spin coating, and prebaked for 100 seconds on a hot plate at 100° C.

A solution of 5 wt % of polyolefine resin in methylcyclohexane was applied onto the wafer by spin coating, and the solution did not uniformly spread over the wafer without forming a protecting film.

What is claimed is:

1. A radiation sensitive material comprising:

a copolymer including a first unit structure expressed by a general formula:

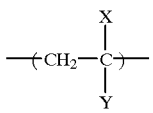

where X represents $CH_3$ or H and Y is a nitrile group and a second unit structure generating an alkali soluble group; and a substance generating an acid by application of radiation, wherein the first unit structure is acrylonitrile or methacrylonitrile.

2. A radiation sensitive material according to claim 1, wherein the copolymer includes t-butyl groups.

3. A radiation sensitive material according to claim 1, wherein the copolymer includes alicyclic groups.

4. A radiation sensitive material according to claim 1, wherein the copolymer includes the acrylonitrile or methacrylonitrile by 10–70 mol %.

* * * * *